(12) United States Patent
Cheng et al.

(10) Patent No.: US 12,007,173 B2
(45) Date of Patent: Jun. 11, 2024

(54) VAPOR CHAMBER HAVING A RESERVOIR

(71) Applicant: Razer (Asia-Pacific) Pte. Ltd., Singapore (SG)

(72) Inventors: ChengYu Cheng, Singapore (SG); FuMei Wang, Singapore (SG); YiHsiang Hung, Singapore (SG)

(73) Assignee: Razer (Asia-Pacific) Pte. Ltd., Singapore (SG)

( * ) Notice: Subject to any disclaimer, the term of this patent is extended or adjusted under 35 U.S.C. 154(b) by 0 days.

(21) Appl. No.: 18/256,604

(22) PCT Filed: Dec. 30, 2020

(86) PCT No.: PCT/SG2020/050795
§ 371 (c)(1),
(2) Date: Jun. 8, 2023

(87) PCT Pub. No.: WO2022/146226
PCT Pub. Date: Jul. 7, 2022

(65) Prior Publication Data
US 2023/0392874 A1    Dec. 7, 2023

(51) Int. Cl.
*F28D 15/04*    (2006.01)
(52) U.S. Cl.
CPC .................................. *F28D 15/046* (2013.01)
(58) Field of Classification Search
CPC . F28D 15/046; F28D 15/0233; H01L 23/427; H01L 23/3672
See application file for complete search history.

(56) References Cited

U.S. PATENT DOCUMENTS 7,422,053 B2 *  9/2008  Siu .......................... F28F 3/02
                                               165/104.33
7,913,748 B2    3/2011  Lin et al.
(Continued)

FOREIGN PATENT DOCUMENTS

CN        101162133 A      4/2008
CN        105452795 A      3/2016
(Continued)

OTHER PUBLICATIONS

ISR/WO issued for corresponding International Application No. PCT/SG2020/050795 (6 pages).
(Continued)

*Primary Examiner* — Tho V Duong
(74) *Attorney, Agent, or Firm* — Polsinelli PC

(57) ABSTRACT

In some aspects, a vapor chamber includes a sealed enclosure. The sealed enclosure includes: a main chamber; a first elongate chamber extending laterally from a first side of the main chamber; and a second elongate chamber extending laterally from a second, opposite side of the main chamber. The vapor chamber further includes a first capillary structure lining a first interior surface of the sealed enclosure, and a second capillary structure lining a second, opposite interior surface of the sealed enclosure. Distal portions of the first elongate chamber and the second elongate chamber are configured as reservoirs that store an excess volume of a working fluid in a liquid state when a heat source is in a first operating state, and release the excess volume of the working fluid towards the main chamber when the heat source is in a second operating state.

18 Claims, 19 Drawing Sheets

(56) References Cited

U.S. PATENT DOCUMENTS

| | | | |
|---|---|---|---|
| 8,074,706 B2* | 12/2011 | Su | F28D 15/046 |
| | | | 165/185 |
| 9,250,025 B2 | 2/2016 | Lee | |
| 9,504,185 B2 | 11/2016 | Xiang et al. | |
| 9,746,248 B2* | 8/2017 | Semenov | F28F 1/24 |
| 10,678,314 B2 | 6/2020 | Ho et al. | |
| 2002/0062648 A1 | 5/2002 | Ghoshal | |
| 2006/0037737 A1* | 2/2006 | Chen | F28D 15/0233 |
| | | | 257/E23.088 |
| 2006/0131002 A1* | 6/2006 | Mochizuki | F28D 15/046 |
| | | | 165/104.26 |
| 2017/0102189 A1* | 4/2017 | Anderl | F28D 15/0275 |
| 2017/0227296 A1 | 8/2017 | Mohaupt et al. | |
| 2019/0171263 A1* | 6/2019 | Winkel | G06F 1/3206 |
| 2019/0335619 A1 | 10/2019 | Tseng et al. | |
| 2019/0339020 A1 | 11/2019 | Tseng et al. | |
| 2020/0003499 A1 | 1/2020 | Kume et al. | |
| 2020/0144223 A1 | 5/2020 | Tamayama | |
| 2020/0281095 A1 | 9/2020 | Rush et al. | |
| 2020/0315069 A1 | 10/2020 | Chiu et al. | |
| 2020/0340756 A1 | 10/2020 | Lin et al. | |

FOREIGN PATENT DOCUMENTS

| | | |
|---|---|---|
| CN | 109323608 A | 2/2019 |
| CN | 106535565 B | 4/2019 |
| CN | 106653713 B | 6/2019 |
| JP | 3086774 U | 7/2002 |
| WO | 2016058966 A1 | 4/2016 |

OTHER PUBLICATIONS

CN Office Action, CN Patent Application No. 2020801077432, dated Sep. 29, 2023, 6 pages.

* cited by examiner

VAPOR CHAMBER HAVING A RESERVOIR

TECHNICAL FIELD

The present disclosure generally relates to a vapor chamber having a reservoir.

BACKGROUND

The operation of electronic devices requires satisfactory thermal management to ensure proper function. As electronic devices become heated, the devices can suffer from device degradation, functional failure, and lower lifespan.

A heat sink can be used for removing heat from an electronic device to the ambient. The performance of a heat sink can be characterized by its thermal resistance, with a lower value representing a higher performance level. The thermal resistance generally includes the heat-spreading resistance within the heat sink and the convective resistance between the heat sink surface and the ambient environment. To minimize the heat-spreading resistance, materials with high thermal conductivity (e.g., copper and aluminum) are typically used to make the heat sink. However, this conductive heat transfer through solid materials is generally insufficient to meet the higher cooling requirements of modern electronic devices having large-scale electronic integration and high-performance processors. Thus, more efficient mechanisms have been developed and evaluated, and a vapor chamber has been one of those commonly considered mechanisms.

Vapor chambers make use of the heat pipe principle that combines the principles of thermal conductivity and phase transition to remove heat from an electronic device to the ambient. In a vapor chamber, a working fluid in contact with a first surface of the vapor chamber (e.g., a surface of the vapor chamber in contact with a heat source of the electronic device) turns into a vapor by absorbing heat from that surface. The vapor then travels within the vapor chamber to a second, cooler surface of the vapor chamber and condenses back into a liquid, thus releasing the latent heat. The working fluid then returns to the first surface of the vapor chamber (e.g., through capillary action, centrifugal force, or gravity) and the cycle repeats.

Despite its advantage over heat sinks, existing vapor chambers may not be effective in dispersing heat from modern electronic devices having one or more high-performance processors that can operate in multiple modes. For example, due to space and form factor constraints, an electronic device may be provided with one vapor chamber. The single vapor chamber may be designed for dissipating heat either when the processor is operating in the steady state power mode or when the processor is operating in the turbo power mode, but may not be suited for both operational states of the processor. For example, when the single vapor chamber is designed for dissipating heat when the processor is operating in the steady state power mode, the amount of coolant in the vapor chamber may be optimized for such a purpose. However, a larger amount of coolant may be needed to dissipate the heat effectively when the processor is operating in the turbo power mode. Consequently, the single vapor chamber designed for dissipating heat when the processor is operating in the steady state power mode would be ineffective in dissipating heat when the processor is operating in the turbo power mode. As another example, when the single vapor chamber is designed for dissipating heat when the processor is operating in the turbo power mode, the amount of coolant in the vapor chamber may be optimised for such purpose. Furthermore, the thickness of such a vapor chamber may be greater. However, the increase in the thickness of such a vapor chamber and the volume of coolant in it can lead to an increase in the thermal resistance of such a vapor chamber. Consequently, the single vapor chamber designed for dissipating heat when the processor is operating in the turbo power mode would be ineffective in dissipating heat when the processor is operating in the steady state power mode.

Therefore, there exists a need for vapor chambers that eliminate or substantially reduce the tradeoff between efficient heat dissipation when the processor is operating in the turbo power mode and efficient heat dissipation when the processor is operating in the steady state power mode. Specifically, there exists a need for vapor chambers that can efficiently dissipate heat from a processor when the processor is operating in the steady state power mode and when the processor is operating in the turbo power mode.

SUMMARY

According to a first aspect of the present disclosure, a vapor chamber is provided. The vapor chamber may include a sealed enclosure. The sealed enclosure may include: a main chamber; a first elongate chamber extending laterally from a first side of the main chamber; and a second elongate chamber extending laterally from a second, opposite side of the main chamber. The vapor chamber may further include a first capillary structure lining a first interior surface of the sealed enclosure, and a second capillary structure lining a second, opposite interior surface of the sealed enclosure. Distal portions of the first elongate chamber and the second elongate chamber may be configured as reservoirs that store an excess volume of a working fluid in a liquid state when a heat source is in a first operating state and release the excess volume of the working fluid towards the main chamber when the heat source is in a second operating state.

According to a second aspect of the present disclosure, a vapor chamber is provided. The vapor chamber may include a cover portion secured to a base portion to form a sealed enclosure. The sealed enclosure may include: a main chamber; a first elongate chamber extending laterally in a first direction from a first side of the main chamber; and a second elongate chamber extending laterally in a second, opposite direction from a second, opposite side of the main chamber. A width of the main chamber may be greater than a width of the first elongate chamber and a width of the second elongate chamber. The vapor chamber may further include: a first capillary structure disposed in the main chamber, the first elongate chamber, and the second elongate chamber, the first capillary structure lining a first interior surface of the sealed enclosure; and a second capillary structure disposed in the main chamber, the first elongate chamber, and the second elongate chamber, the second capillary structure lining a second, opposite interior surface of the sealed enclosure. Portions of the first capillary structure and the second capillary structure disposed in distal portions of the first elongate chamber and the second elongate chamber may be configured as reservoirs that modulate a volume of a working fluid circulating in the vapor chamber based on an operating state of a heat source.

According to a third aspect of the present disclosure a system is provided. The system may include a processor and a vapor chamber, where the processor is in physical contact with a surface of the vapor chamber. The vapor chamber may include a sealed enclosure including: a main chamber; a first elongate chamber extending laterally from a first side of the main chamber; and a second elongate chamber extending laterally from a second, opposite side of the main chamber. The vapor chamber may further include a first capillary structure lining a first interior surface of the sealed enclosure, and a second capillary structure lining a second, opposite interior surface of the sealed enclosure. Distal portions of the first elongate chamber and the second elongate chamber may be configured as reservoirs that modulate a volume of a working fluid circulating in the vapor chamber based on an operating state of the processor.

DETAILED DESCRIPTION

Figure 1:
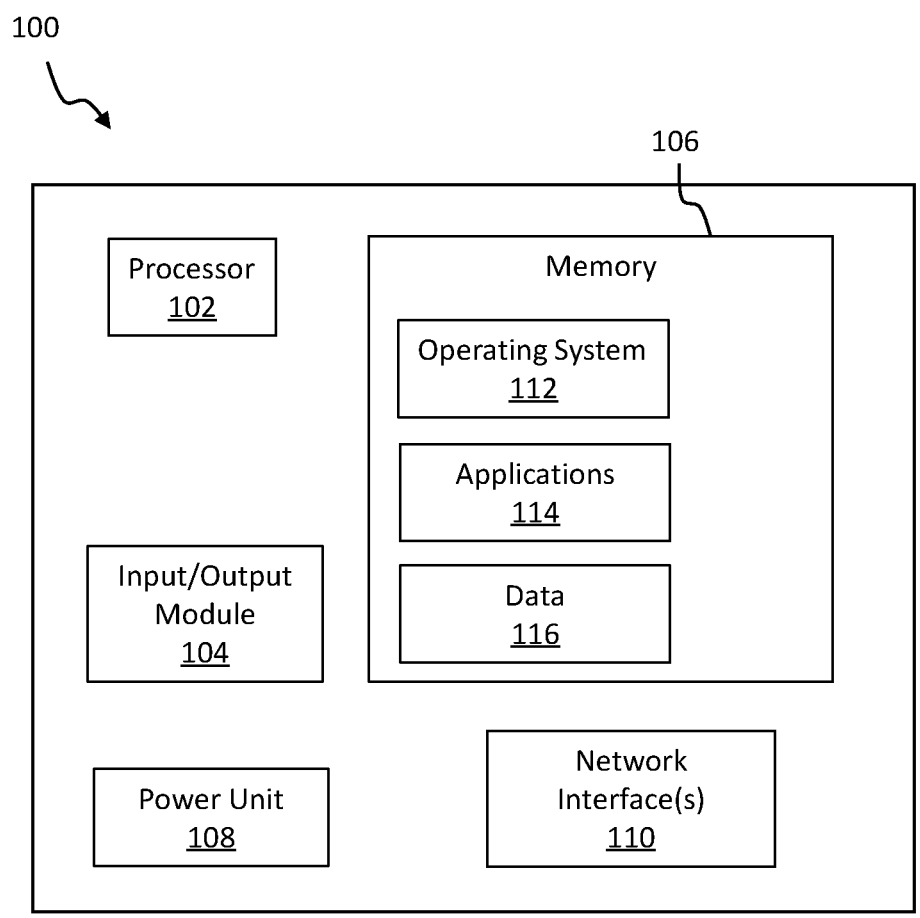
FIG. 1 is a block diagram showing an example electronic device, according to an implementation of the present disclosure.

Implementations described below in the context of a device, apparatus, or system are analogously valid for the respective methods, and vice versa. Furthermore, it will be understood that the implementations described below may be combined, for example, a part of one implementation may be combined with a part of another implementation.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

In some aspects of what is described here, a vapor chamber may include a main, central chamber and elongate chambers that extend laterally in opposite directions from opposite sides of the main chamber. The vapor chamber may include capillary structures in the central and elongate chambers. Each of the elongate chambers may include a reservoir disposed at a distal portion of the respective elongate chamber (e.g., the portion of the elongate chamber farthest from the main, central chamber). In some aspects, the reservoirs may be located outside of a footprint of fin structures that are formed on a planar surface of the vapor chamber. The reservoirs may be configured to store an excess volume of working fluid (e.g., in the liquid state) that can be tapped when a processor is operating in a turbo power mode. Conversely, when the processor is operating in a steady state power mode, a nominal volume of working fluid may be used to dissipate heat from the processor, and the excess volume of the working fluid (e.g., in the liquid state) may be stored in the reservoirs when the processor is operating in the steady state power mode. These portions of the elongate chambers may be suitable as reservoirs since these portions may be the coolest portions of the vapor chamber, thus facilitating the storage of a liquid medium (e.g., working fluid in the liquid state) in the portions of the capillary structures disposed in the reservoirs. Provision of the reservoirs may allow the vapor chamber to modulate the volume of working fluid circulating in the vapor chamber (e.g., used in the evaporation-condensation cycles) based on the operating state of the processor.

In some instances, aspects of the systems and techniques described here provide technical improvements and advantages over existing approaches. For example, the proposed vapor chamber eliminates or substantially reduces the tradeoff between efficient heat dissipation when the processor is operating in the turbo power mode and efficient heat dissipation when the processor is operating in the steady state power mode. Specifically, the proposed vapor chamber can efficiently dissipate heat from a processor when the processor is operating in the steady state power mode and when the processor is operating in the turbo power mode. Furthermore, since the volume of working fluid used in the evaporation-condensation cycles is modulated based on the operating state of the processor, the proposed vapor chamber achieves low thermal resistance regardless of whether the processor is operating in the turbo power mode or in the steady state power mode. The proposed vapor chamber can also offer flexible design capabilities and can allow processors to be run at a high-performance state without compromising heat dissipation and device lifespan.

The following examples pertain to various aspects of the present disclosure.

Example 1 is a vapor chamber including: a sealed enclosure. The sealed enclosure includes: a main chamber; a first elongate chamber extending laterally from a first side of the main chamber; and a second elongate chamber extending laterally from a second, opposite side of the main chamber. The vapor chamber also includes a first capillary structure lining a first interior surface of the sealed enclosure, and a second capillary structure lining a second, opposite interior surface of the sealed enclosure. Distal portions of the first elongate chamber and the second elongate chamber are configured as reservoirs that store an excess volume of a working fluid in a liquid state when a heat source is in a first operating state and release the excess volume of the working fluid towards the main chamber when the heat source is in a second operating state.

In Example 2, the subject matter of Example 1 may optionally include that the heat source includes a processor, and the first operating state is a steady state power mode of the processor, and the second operating state is a turbo power mode of the processor.

In Example 3, the subject matter of any one of Examples 1 to 2 may optionally include that portions of the first capillary structure and the second capillary structure disposed in the distal portions of the first elongate chamber and the second elongate chamber are configured as the reservoirs.

In Example 4, the subject matter of any one of Examples 1 to 3 may optionally include that the excess volume of the working fluid is stored in and released from the portions of the first capillary structure and the second capillary structure disposed in the distal portions of the first elongate chamber and the second elongate chamber.

In Example 5, the subject matter of any one of Examples 1 to 4 may optionally include that each of the first capillary structure and the second capillary structure includes at least one of a sintered metal-containing powder, one or more layers of a metal-containing mesh, one or more layers of a metal-containing foam, or a metal-containing fiber structure.

In Example 6, the subject matter of any one of Examples 1 to 5 may optionally include that the distal portions of the first elongate chamber and the second elongate chamber are disposed outside a footprint of a heat dissipation structure disposed on an exterior surface of the vapor chamber.

In Example 7, the subject matter of any one of Examples 1 to 6 may optionally include that the heat dissipation structure includes a first fin structure disposed over a portion of the first elongate chamber, where the distal portion of the first elongate chamber is outside of the footprint of the first fin structure.

In Example 8, the subject matter of any one of Examples 1 to 7 may optionally include that the heat dissipation structure includes a second fin structure disposed over a portion of the second elongate chamber, where the distal portion of the second elongate chamber is outside of the footprint of the second fin structure.

In Example 9, the subject matter of any one of Examples 1 to 8 may optionally include a third capillary structure attached to the first capillary structure, where the third capillary structure is positioned between the first capillary structure and the second capillary structure.

In Example 10, the subject matter of any one of Examples 1 to 9 may optionally include that a distance between the first interior surface of the sealed enclosure and the second interior surface of the sealed enclosure in the main chamber is less than a distance between the first interior surface of the sealed enclosure and the second interior surface of the sealed enclosure in the reservoirs.

In Example 11, the subject matter of any one of Examples 1 to 10 may optionally include a reservoir capillary structure disposed in each of the reservoirs, the reservoir capillary structure positioned between the third capillary structure and the second capillary structure.

Example 12 is a vapor chamber including: a cover portion secured to a base portion to form a sealed enclosure. The sealed enclosure includes: a main chamber; a first elongate chamber extending laterally in a first direction from a first side of the main chamber; and a second elongate chamber extending laterally in a second, opposite direction from a second, opposite side of the main chamber, where a width of the main chamber is greater than a width of the first elongate chamber and a width of the second elongate chamber. The vapor chamber also includes: a first capillary structure disposed in the main chamber, the first elongate chamber, and the second elongate chamber, the first capillary structure lining a first interior surface of the sealed enclosure; and a second capillary structure disposed in the main chamber, the first elongate chamber, and the second elongate chamber, the second capillary structure lining a second, opposite interior surface of the sealed enclosure. Portions of the first capillary structure and the second capillary structure disposed in distal portions of the first elongate chamber and the second elongate chamber are configured as reservoirs that modulate a volume of a working fluid circulating in the vapor chamber based on an operating state of a heat source.

In Example 13, the subject matter of Example 12 may optionally include that the reservoirs are configured to: store an excess volume of the working fluid in a liquid state when the heat source is in a first operating state; and release the excess volume of the working fluid towards the main chamber when the heat source is in a second operating state.

In Example 14, the subject matter of any one of Examples 12 to 13 may optionally include that: in the first operating state of the heat source, a nominal volume of the working fluid is configured to circulate in the vapor chamber; and in the second operating state of the heat source, the nominal volume of the working fluid and the excess volume of the working fluid are configured to circulate in the vapor chamber.

In Example 15, the subject matter of any one of Examples 12 to 14 may optionally include that the nominal volume of the working fluid is substantially equal to the excess volume of the working fluid.

In Example 16, the subject matter of any one of Examples 12 to 15 may optionally include that the heat source includes a processor, and the first operating state is a steady state power mode of the processor, and the second operating state is a turbo power mode of the processor.

In Example 17, the subject matter of any one of Examples 12 to 16 may optionally include that each of the first capillary structure and the second capillary structure includes at least one of a sintered metal-containing powder, one or more layers of a metal-containing mesh, one or more layers of a metal-containing foam, or a metal-containing fiber structure.

In Example 18, the subject matter of any one of Examples 12 to 17 may optionally include that the distal portions of the first elongate chamber and the second elongate chamber are disposed outside a footprint of a heat dissipation structure disposed on an exterior surface of the vapor chamber.

In Example 19, the subject matter of any one of Examples 12 to 18 may optionally include that the heat dissipation structure includes a first fin structure formed on the cover portion and disposed over a portion of the first elongate chamber, where the distal portion of the first elongate chamber is outside of the footprint of the first fin structure.

In Example 20, the subject matter of any one of Examples 12 to 19 may optionally include that the heat dissipation structure includes a second fin structure formed on the cover portion and disposed over a portion of the second elongate chamber, where the distal portion of the second elongate chamber is outside of the footprint of the second fin structure.

In Example 21, the subject matter of any one of Examples 12 to 20 may optionally include a third capillary structure attached to the first capillary structure, where the third capillary structure is positioned between the first capillary structure and the second capillary structure.

In Example 22, the subject matter of any one of Examples 12 to 21 may optionally include that a distance between the first interior surface of the sealed enclosure and the second interior surface of the sealed enclosure in the main chamber is less than a distance between the first interior surface of the sealed enclosure and the second interior surface of the sealed enclosure in the reservoirs.

In Example 23, the subject matter of any one of Examples 12 to 22 may optionally include a reservoir capillary structure disposed in each of the reservoirs, the reservoir capillary structure positioned between the third capillary structure and the second capillary structure.

Example 24 is a system including: a processor and a vapor chamber, where the processor is in physical contact with a surface of the vapor chamber. The vapor chamber includes a sealed enclosure including: a main chamber; a first elongate chamber extending laterally from a first side of the main chamber; and a second elongate chamber extending laterally from a second, opposite side of the main chamber. The vapor chamber further includes a first capillary structure lining a first interior surface of the sealed enclosure, and a second capillary structure lining a second, opposite interior surface of the sealed enclosure. Portions of the first capillary structure and the second capillary structure disposed in distal portions of the first elongate chamber and the second elongate chamber are configured as reservoirs that modulate a volume of a working fluid circulating in the vapor chamber based on an operating state of the processor.

In Example 25, the subject matter of Example 24 may optionally include that portions of the first capillary structure and the second capillary structure disposed in the distal portions of the first elongate chamber and the second elongate chamber are configured as the reservoirs.

In Example 26, the subject matter of any one of Examples 24 to 25 may optionally include that the distal portions of the first elongate chamber and the second elongate chamber are disposed outside a footprint of a heat dissipation structure disposed on an exterior surface of the vapor chamber.

In Example 27, the subject matter of any one of Examples 24 to 26 may optionally include a circuit board, where the processor is attached to the circuit board and positioned between the circuit board and the vapor chamber.

In Example 28, the subject matter of any one of Examples 24 to 27 may optionally include that in a first operating state of the processor, a nominal volume of the working fluid is configured to circulate in the vapor chamber; and in a second operating state of the processor, the nominal volume and the excess volume of the working fluid are configured to circulate in the vapor chamber.

In Example 29, the subject matter of any one of Examples 24 to 28 may optionally include that the nominal volume of the working fluid is substantially equal to the excess volume of the working fluid.

In Example 30, the subject matter of any one of Examples 24 to 29 may optionally include that the reservoirs are configured to: store the excess volume of the working fluid in a liquid state when the processor is in the first operating state; and release the excess volume of the working fluid towards the main chamber when the processor is in the second operating state.

In Example 31, the subject matter of any one of Examples 24 to 30 may optionally include that the first operating state is a steady state power mode of the processor, and the second operating state is a turbo power mode of the processor.

In Example 32, the subject matter of any one of Examples 24 to 31 may optionally include that each of the first capillary structure and the second capillary structure includes at least one of a sintered metal-containing powder, one or more layers of a metal-containing mesh, one or more layers of a metal-containing foam, or a metal-containing fiber structure.

In Example 33, the subject matter of any one of Examples 24 to 32 may optionally include that the vapor chamber further includes a third capillary structure attached to the first capillary structure, where the third capillary structure is positioned between the first capillary structure and the second capillary structure.

In Example 34, the subject matter of any one of Examples 24 to 33 may optionally include that a distance between the first interior surface of the sealed enclosure and the second interior surface of the sealed enclosure in the main chamber is less than a distance between the first interior surface of the sealed enclosure and the second interior surface of the sealed enclosure in the reservoirs.

In Example 35, the subject matter of any one of Examples 24 to 34 may optionally include that the vapor chamber further includes a reservoir capillary structure disposed in each of the reservoirs, the reservoir capillary structure positioned between the third capillary structure and the second capillary structure.

FIG. 1 is a block diagram showing an example electronic device 100, according to an implementation of the present disclosure. The electronic device 100 may be a laptop computer, a desktop computer, a tablet computer, an automobile computer, a game console, a smart phone, a personal digital assistant, a server, or other electronic devices capable of running computer applications. In some implementations, the electronic device 100 includes a processor 102, an input/output (I/O) module 104, memory 106, a power unit 108, and one or more network interfaces 110. The electronic device 110 can include additional components. In some implementations, the processor 102, input/output (I/O) module 104, memory 106, power unit 108, and the network interface(s) 110 are housed together in a common housing or other assembly.

The example processor 102 can execute instructions, for example, to generate output data based on data inputs. The instructions can include programs, codes, scripts, modules, or other types of data stored in memory (e.g., memory 106). Additionally or alternatively, the instructions can be encoded as pre-programmed or re-programmable logic circuits, logic gates, or other types of hardware or firmware components or modules. The processor 102 may be, or may include, a multicore processor having a plurality of cores, and each such core may have an independent power domain and can be configured to enter and exit different operating or performance states based on workload. Additionally or alternatively, the processor 102 may be, or may include, a general-purpose microprocessor, as a specialized co-processor or another type of data processing apparatus. In some cases, the processor 102 performs high-level operation of the electronic device 100. For example, the processor 102 may be configured to execute or interpret software, scripts, programs, functions, executables, or other instructions stored in the memory 106.

The example I/O module 104 may include a mouse, keypad, touch screen, scanner, optical reader, and/or stylus (or other input device(s)) through which a user of the electronic device 100 may provide input to the electronic device 100, and may also include one or more of a speaker for providing audio output and a video display device for providing textual, audiovisual, and/or graphical output.

The example memory 106 may include computer-readable storage media, for example, a volatile memory device, a non-volatile memory device, or both. The memory 106 may include one or more read-only memory devices, random-access memory devices, buffer memory devices, or a combination of these and other types of memory devices. In some instances, one or more components of the memory can be integrated or otherwise associated with another component of the electronic device 100. The memory 106 may store instructions that are executable by the processor 102. In some examples, the memory 106 may store instructions for an operating system 112 and for application programs 114. The memory 106 may also store a database 116.

The example power unit 108 provides power to the other components of the electronic device 100. For example, the other components may operate based on electrical power provided by the power unit 108 through a voltage bus or other connection. In some implementations, the power unit 108 includes a battery or a battery system, for example, a rechargeable battery. In some implementations, the power unit 108 includes an adapter (e.g., an AC adapter) that receives an external power signal (from an external source) and coverts the external power signal to an internal power signal conditioned for a component of the electronic device 100. The power unit 108 may include other components or operate in another manner.

The electronic device 100 may be configured to operate in a wireless, wired, or cloud network environment (or a combination thereof). In some implementations, the electronic device 100 can access the network using the network interface(s) 110. The network interface(s) 110 can include one or more adapters, modems, connectors, sockets, terminals, ports, slots, and the like. The wireless network that the electronic device 100 accesses may operate, for example, according to a wireless network standard or another type of wireless communication protocol. For example, the wireless network may be configured to operate as a Wireless Local Area Network (WLAN), a Personal Area Network (PAN), a metropolitan area network (MAN), or another type of wireless network. Examples of WLANs include networks configured to operate according to one or more of the 802.11 family of standards developed by IEEE (e.g., Wi-Fi networks), and others. Examples of PANs include networks that operate according to short-range communication standards (e.g., BLUETOOTH®, Near Field Communication (NFC), ZigBee), millimeter wave communications, and others. The wired network that the electronic device 100 accesses may, for example, include Ethernet, SONET, circuit-switched networks (e.g., using components such as SS7, cable, and the like), and others.

Figure 2:
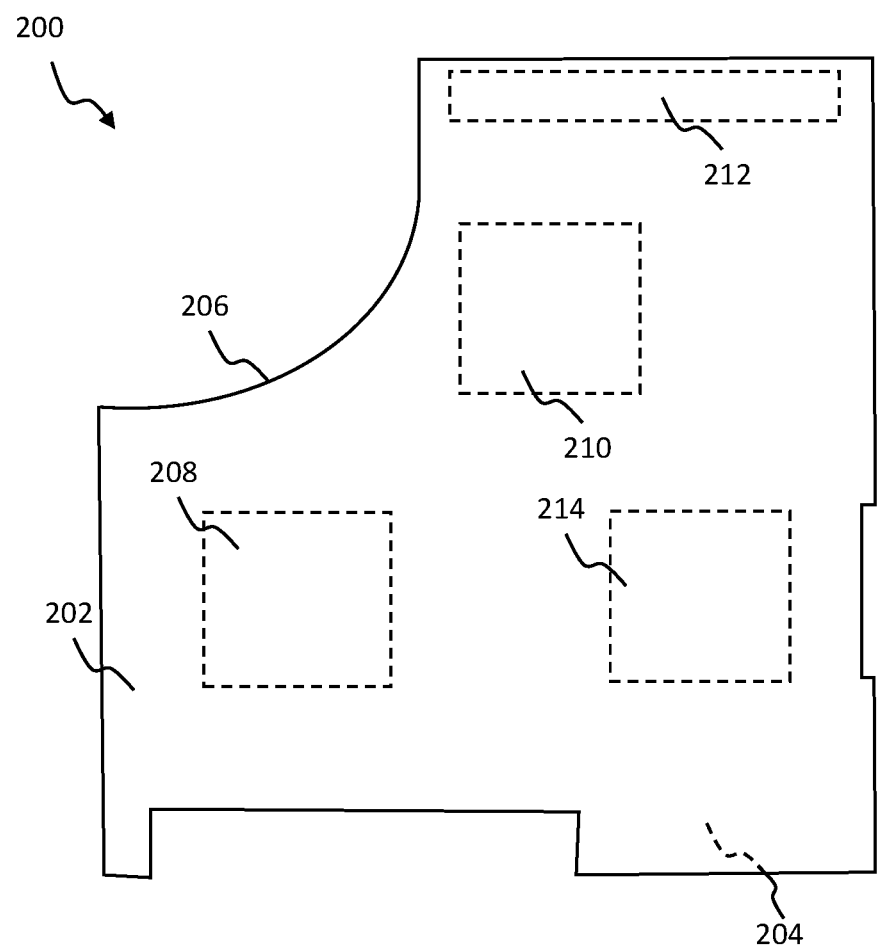
FIG. 2 is a schematic diagram showing a structure of an example circuit board, according to an implementation of the present disclosure.

In some implementations, the various components of the electronic device 100 may be disposed on one or more planar surfaces of a circuit board (e.g., a motherboard) that electrically and communicatively connects the various components of the electronic device 100 to one another. FIG. 2 is a schematic diagram showing a structure of an example circuit board 200, according to an implementation of the present disclosure. The shape of the circuit board 200 shown in FIG. 2 is merely exemplary; the shape of the circuit board 200 may be different in other implementations. The circuit board 200 may be a motherboard of the electronic device 100 and may include a first (e.g., a top) surface 202 and a second (e.g., a bottom), opposing surface 204. In some instances, the circuit board 200 may define a cutout 206 in a corner of the circuit board 200. In the example of FIG. 2, the circuit board 200 includes a first area 208, a second area 210, a third area 212, and a fourth area 214. The areas 208, 210, 212, 214 shown in the FIG. 2 are merely exemplary, and the number of areas and their relative positions may be different in other implementations. The areas 208, 210, 212, 214 may be configured to receive various components of the electronic device 100, examples being the processor 102, I/O module 104, memory 106, power unit 108, and the network interface(s) 110 shown in FIG. 1. In some instances, these components of the electronic device 100 may be mounted on the circuit board 200, and the circuit board 200 may connect one or more hardware components of the electronic device 100 to the processor 102, distribute power from the power unit 108, or define the types of storage devices, memory modules, and graphics cards (among other expansion cards) that can connect to other components of the electronic device 100.

Figure 3:
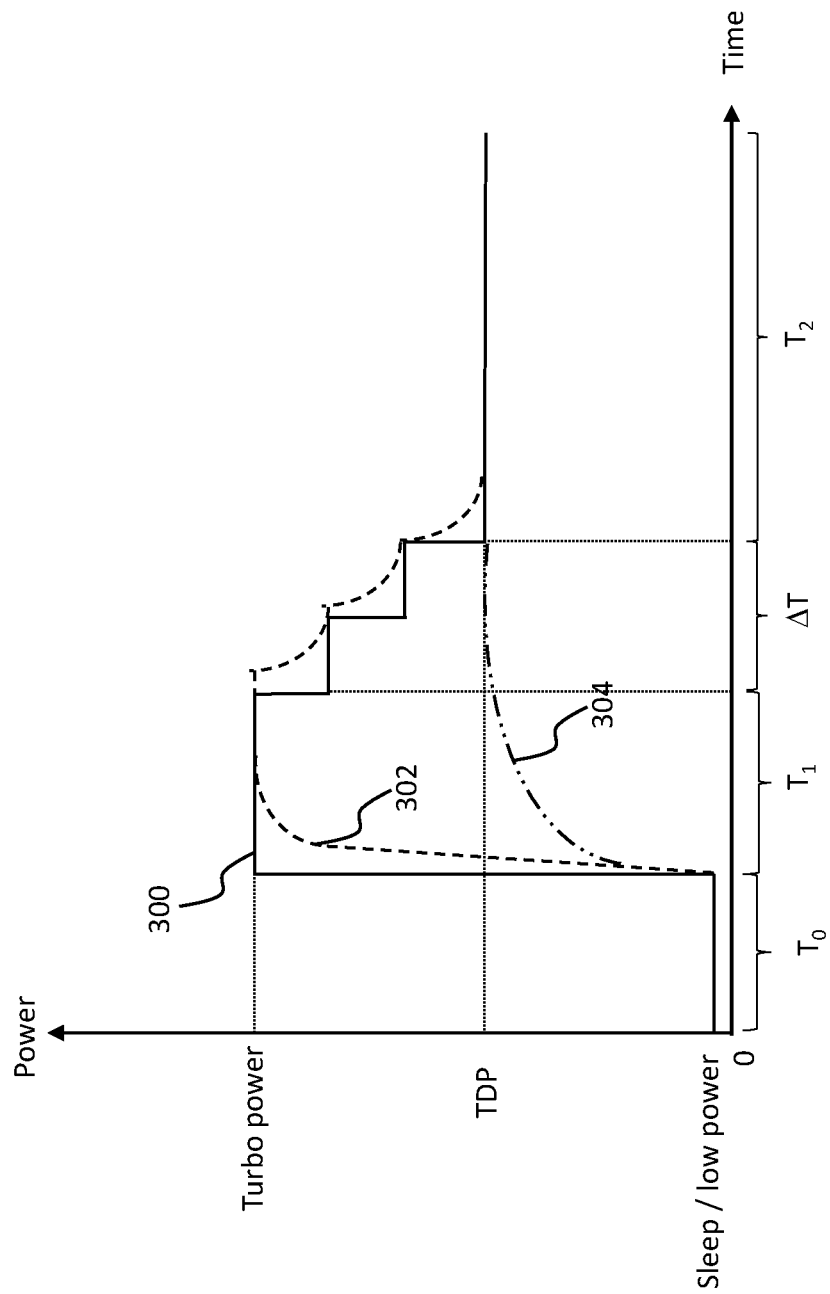
FIG. 3 is a diagram showing an example graph illustrating processor power levels when a processor is in different operating states, according to an implementation of the present disclosure.

The processor 102 may have multiple operating states, and may be configured to be in different operating states at different times. FIG. 3 is a diagram showing an example graph 300 illustrating processor power levels when a processor is in different operating states, according to an implementation of the present disclosure. The horizontal axis of graph 300 denotes time (in arbitrary units), and the vertical axis of the graph 300 denotes power (in arbitrary units). As seen in FIG. 3, the processor 102 may initially be idle during an initial time period $T_0$. During the initial time period $T_0$, the processor 102 may be in a sleep or low power state and may build up a thermal budget. Following the initial time period $T_0$, the processor 102 may enter a turbo power mode and be in the turbo power mode for a first operating time period $T_1$. In some implementations, when in the turbo power mode, the processor 102 may operate above thermal design power (TDP) specifications. Specifically, after the initial time period $T_0$ (e.g., the processor idle period), the processor 102 has accumulated enough thermal budget to accommodate high power/performance for the first operating time period $T_1$. In some instances, the first operating time period $T_1$ may be in a range from about 60 seconds to about 180 seconds, although other time durations are possible in other instances.

Following the first operating time period $T_1$, the thermal budget previously accumulated by the processor 102 has been exhausted. Consequently, following the first operating time period $T_1$, the processor 102 may stabilize to a normal operation mode or a steady state power mode. The turbo power mode differs from the steady state power mode in that the processor 102, in the turbo power mode, can operate at one or more of the following compared to the steady state power mode: a higher voltage, a higher current, a higher power, a higher load capacity, or a higher clock speed. Consequently, when in the turbo power mode, the processor 102 can operate with greater performance and can perform more processor-intensive computations (e.g., for gaming applications).

In some instances (e.g., as in the example of FIG. 3), there may be a transition period $\Delta T$ between an end of the turbo power mode and a commencement of the steady state power mode. The processor 102 may be in the steady state power mode for a second operating time period $T_2$. When in the steady state power mode, the processor 102 may operate at or below the TDP specifications (e.g., at a sustained power state). In general, the first operating time period $T_1$ is shorter than the second operating time period $T_2$, since the turbo power mode may be restricted to one or more portions of the processor 102 in a given thermal envelope (e.g., where the processor 102 includes, or is, a multicore processor). Theoretically, the second operating time period $T_2$ may be indefinitely long (e.g., the the processor 102 can operate at the processor sustained power indefinitely).

When in the steady state power mode, the processor sustained power may be in a range from about 40 Watts (W) to about 60 W (e.g., about 45 W), although other ranges are possible in other instances. For example, the processor sustained power may be different for chipsets of different generations, and, in such instances, the processor sustained power can be in one or more of the following ranges: from about 12 W to about 15 W; from about 20 W to about 28 W; from about 35 W to about 45 W; from about 45 W to about 65 W; or from about 65 W to about 95 W. In some instances, when in the turbo power mode, the processor 102 may operate at a power that is about twice (e.g., in a range from about 1.5 times to about 2.5 times) the processor sustained power. For example, the power consumed by the processor 102 when it is in the turbo power mode may be in a range from about 60 W to about 120 W (e.g., about 90 W), although other ranges are possible in other instances. For example, the power consumed by the processor 102 when it is in the turbo power mode may be different for chipsets of different generations, and turbo power can be in one or more of the following ranges in some instances: from about 35 W to about 40 W; from about 40 W to about 45 W; from about 72 W to about 103 W; or from about 85 W to about 140 W. The power unit 108 may be configured to power the processor 102 when it is in the turbo power mode and the steady state power mode.

The graph 300 illustrates a theoretical graph in which transitions from one power level to another power level are instantaneous. FIG. 3 also shows a graph 302 that illustrates real world transitions from one power level to another. FIG. 3 also shows a graph 304 that illustrates the average power as a function of time. As seen in FIG. 3, although the instantaneous power may exceed the TDP specifications during the turbo power mode and the transition period $\Delta T$, the average power of the processor 102 is within the TDP specifications.

Heat is generated by the processor 102 when the processor 102 is in operation (e.g., regardless of whether in the turbo power mode or the steady state power mode). At the same time, due to prescribed size, shape, and other physical specifications of the electronic device 100, the electronic device 100 may be restricted to having a single vapor chamber to dissipate heat effectively and efficiently from the processor 102 when the processor 102 is operating in the turbo power mode and in the steady state power mode.

Figure 4:
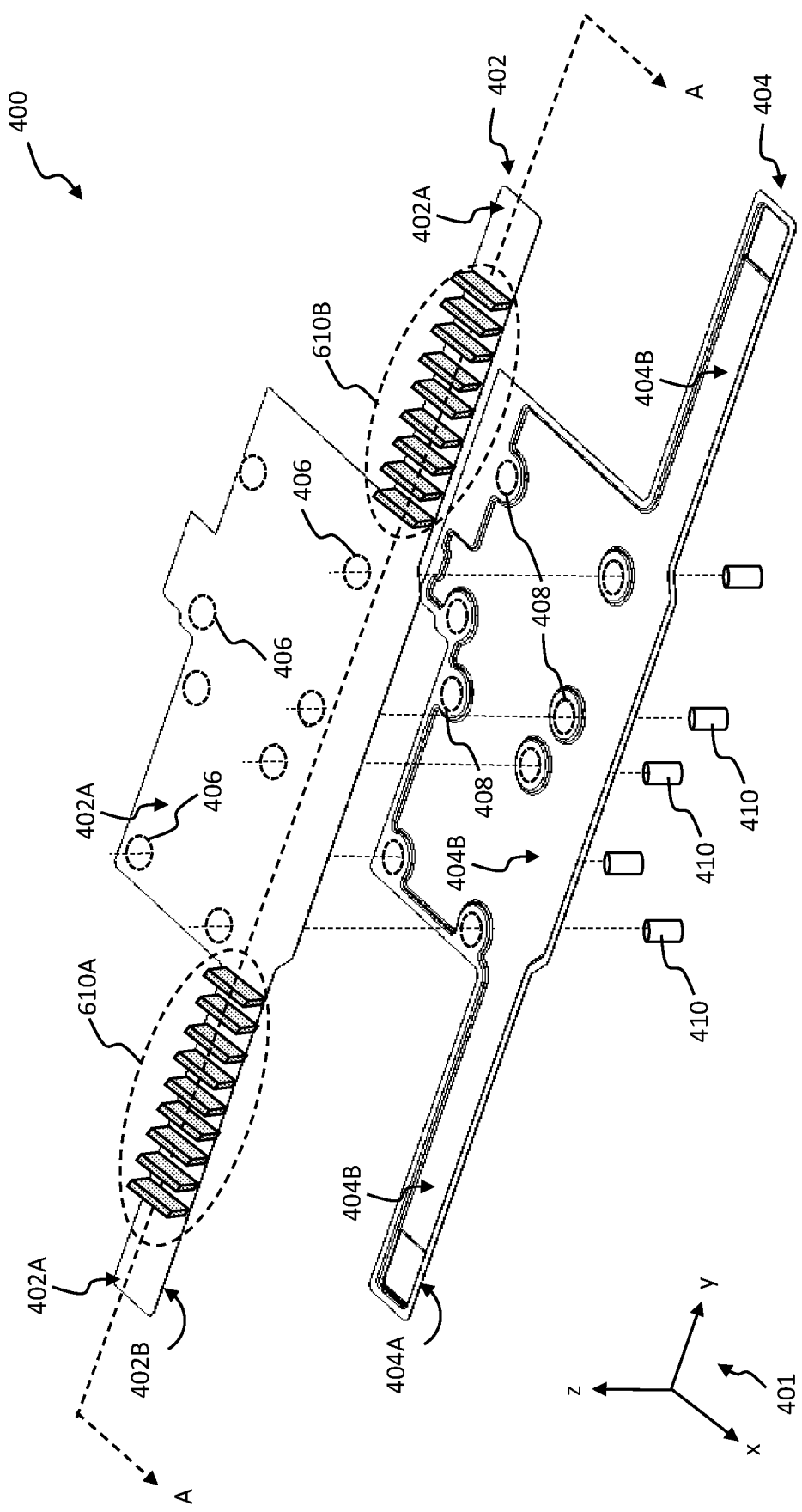
FIG. 4 is a diagram showing an exploded three-dimensional view of an example vapor chamber that may be included in an electronic device, according to an implementation of the present disclosure.
Figure 5:
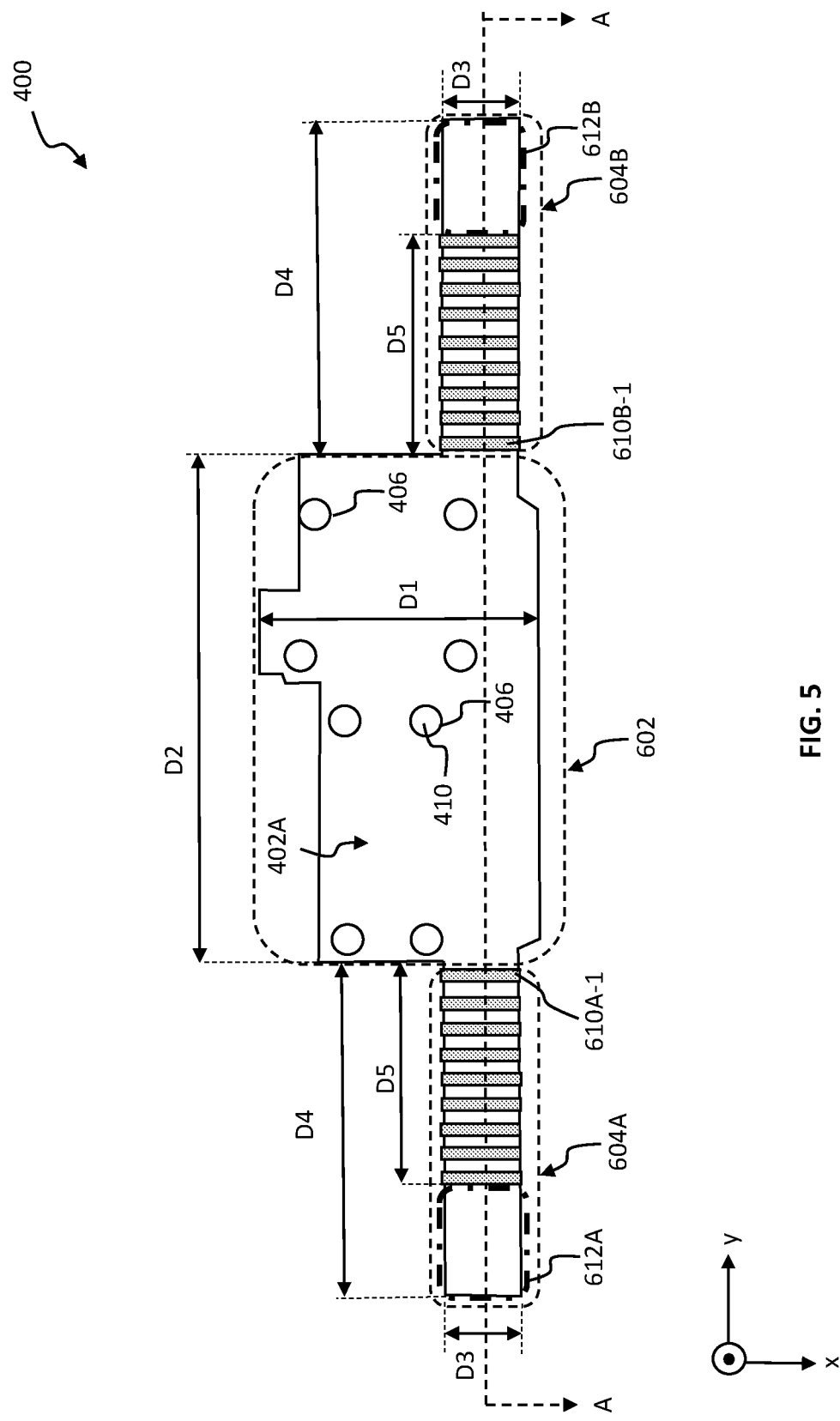
FIG. 5 is a diagram showing a top-down view of the example vapor chamber shown in FIG. 4, according to an implementation of the present disclosure.
Figure 6:
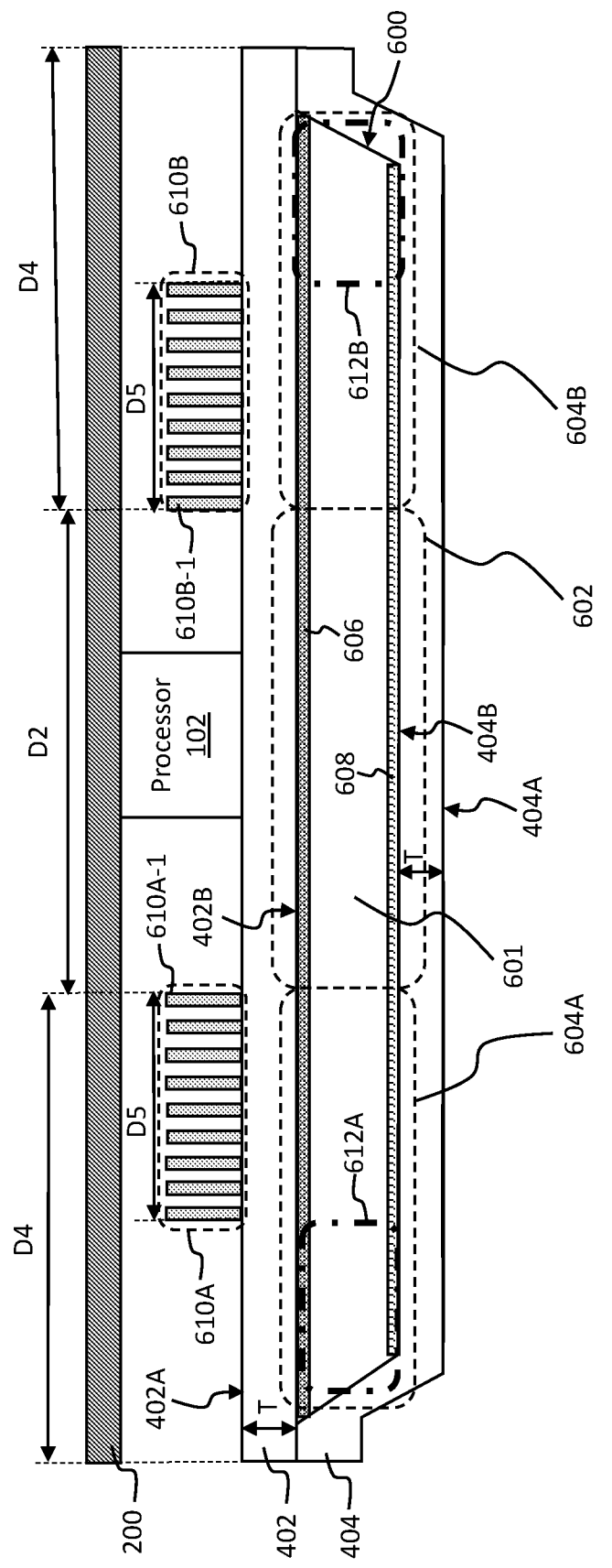
FIG. 6 is a diagram showing a cross-sectional view of the example vapor chamber shown in FIG. 4, according to an implementation of the present disclosure.

FIG. 4 is a diagram showing an exploded three-dimensional view of an example vapor chamber 400 that may be included in an electronic device, according to an implementation of the present disclosure. FIG. 4 also shows a frame of reference 401 having three orthogonal axes. The frame of reference 402 includes a first axis in a first direction (e.g., the X-direction), a second axis in a second direction (e.g., the Y-direction), and a third axis in a third direction (e.g., the Z-direction). The first, second, and third directions are perpendicular to each other. FIG. 5 is a diagram showing a top-down view of the example vapor chamber 400 shown in FIG. 4, according to an implementation of the present disclosure. FIG. 6 is a diagram showing a cross-sectional view of the example vapor chamber 400 shown in FIG. 4, according to an implementations of the present disclosure. FIG. 6 also shows the relative positions of the vapor chamber 400, the processor 102, and the circuit board 200, according to an implementation of the present disclosure. The cross-sectional view shown in FIG. 6 is taken along the line A-A shown in FIGS. 4 and 5.

In contrast to existing vapor chambers (which are optimized for dissipating heat from a processor that is either in a turbo power mode or in a normal operation/steady state power mode, but not both), the vapor chamber 400 proposed in this disclosure is optimized to efficiently dissipate heat from the processor 102 when the processor 102 is in a normal operation/steady state power mode and to efficiently dissipate heat from the processor 102 when the processor 102 is in a turbo power mode. As an example, as described in further detail below, the vapor chamber 400 can modulate the volume of working fluid used in the evaporation-condensation cycles based on the operating state of the processor 102. Furthermore, although various aspects of the present disclosure describe efficiently dissipate heat from the processor 102 based on the operating state of the processor 102, the vapor chamber 400 can be used for any component in an electronic device that has multiple operating states and that generates heat at each operating state.

As seen in FIGS. 4, 5, and 6, the vapor chamber 400 includes a cover portion 402 and a base portion 404. In some implementations, the cover portion 402 and the base portion 404 may be formed from one or more materials having high thermal conductivity (e.g., a material having thermal conductivity greater than or equal to about 200 W/m K). Example materials having high thermal conductivity include copper and aluminum. In some implementations, each of the cover portion 402 and the base portion 404 has a thickness T (e.g., measured in the third direction) that may be greater than or equal to about 0.25 mm (e.g., in a range from about 1.5 mm to about 2 mm).

The cover portion 402 has a first surface 402A and a second surface 402B opposite the first surface 402A. Similarly, the base portion 404 has a first surface 404A and a second surface 404B opposite the first surface 404A. The first surfaces 402A, 404A of the cover and base portions 402, 404 may define the exterior surfaces of the vapor chamber 400. In various aspects, the cover portion 402 and the base portion 404 may be secured to each other to form a sealed, interior enclosure under vacuum pressure that contains one or more capillary structures and a working fluid under pressure that circulates within a sealed enclosure. For example, as seen in FIG. 6, a sealed enclosure 600 may be defined by the second surface 402B of the cover portion 402 and the second surface 404B of the base portion 404.

As seen in FIG. 4, in some aspects, the cover portion 402 includes through holes 406, and the base portion 404 includes through holes 408 that are aligned to the through holes 406. In some instances, the through holes 406, 408 can accommodate screws 410 that can secure the cover portion 402 and the base portion 404 to each other, thereby forming the sealed enclosure 600 of the vapor chamber 400. In some instances, the circuit board 200 may also include through holes that are aligned to the through holes 406, 408. In such instances, the screws 410 may also be used to secure the vapor chamber 400 to the circuit board 200 such that the processor 102 is in physical contact with the surface 402A of the cover portion 402 (e.g., as seen in the example of FIG. 6).

The vapor chamber 400 (e.g., the sealed enclosure 600 of the vapor chamber 400) may include a main (e.g., central) chamber 602. In some implementations, the processor 102 is disposed over a portion of the main chamber 602 (e.g., such that the processor 102 is in physical contact with the surface 402A of the cover portion 402). The main chamber 602 may have a dimension D1 in the first direction (e.g., the farthest lateral extent in the X-direction) and a dimension D2 in the second direction (e.g., the farthest lateral extent in the Y-direction). In some implementations, the dimension D1 may be in a range from about 45 mm to about 115 mm, and the dimension D2 may be in a range from about 114 mm to about 154 mm. The vapor chamber 400 may also include a first elongate chamber 604A and a second elongate chamber 604B that extend laterally (e.g., in opposite directions along the second axis) from opposite sides of the central chamber 602. Each of the elongate chambers 604A, 604B may have a dimension D3 in the first direction (e.g., the farthest lateral extent in the X-direction) and a dimension D4 in the second direction (e.g., the farthest lateral extent in the Y-direction). In some implementations, the dimension D3 may be in a range from about 18 mm to about 25 mm, and the dimension D4 may be in a range from about 60 mm to about 106 mm. Furthermore, a ratio of the dimension D2 to the dimension D4 may be in a range from about 1 to about 2.

In some implementations, the vapor chamber 400 includes a first capillary structure 606 that lines the second surface 402B of the cover portion 402, and a second capillary structure 608 that lines the first surface 404B of the base portion 404. The surface 402B of the cover portion 402 may be referred to as a first interior surface of the sealed enclosure 600, and the surface 404B of the base portion 404 may be referred to as a second interior surface of the sealed enclosure 600. The first and second capillary structures 606, 608 may be separated from each other (e.g., in the third direction) by an air gap 601. In some instances, the first and second capillary structures 606, 608 is evenly (e.g., conformally) formed over an entirety of the surfaces 402B, 404B, respectively, such that the first and second capillary structures 606, 608 are disposed in the main chamber 602, the first elongate chamber 604A, and the second elongate chamber 604B of the sealed enclosure 600.

The first and second capillary structures 606, 608 may be porous wick structures configured to circulate a working fluid in the sealed enclosure 600 by capillary forces. In some instances, the first and second capillary structures 606, 608 may be formed from one or more metals (e.g., copper) and may be in a form of a sintered metal-containing powder, one or more layers of a metal-containing mesh, one or more layers of a metal-containing foam, a metal-containing fiber structure, or a combination thereof. Furthermore, the working fluid used in the sealed enclosure 600 may be water (e.g., distilled water), although other types of working fluid are possible (e.g., a refrigerant, alcohol, ammonia, etc.). In some implementations, the first and second capillary structures 606, 608 are saturated with the working fluid, and the cover and base portions 402, 404 (e.g., having the saturated first and second capillary structures 606, 608 lining the surfaces 402B, 404B thereof) are secured to each other to form the sealed enclosure 600.

The vapor chamber 400 may also include a heat dissipation structure (e.g., a first fin structure 610A and a second fin structure 610B) formed on an exterior surface of the vapor chamber 400 for diffusing heat from the vapor chamber 400 to the ambient/outside environment. The fin structures 610A, 610B may be formed from one or more materials having high thermal conductivity (e.g., a material having thermal conductivity greater than or equal to about 200 W/m K). Example materials having high thermal conductivity include copper and aluminum. The fin structures 610A 610B shown in FIGS. 4, 5, and 6 are merely exemplary, and other types, numbers, arrangements, etc. of fin structures may be possible in other implementations. In some instances, such as in the example of FIGS. 4, 5, and 6, the fin structures closest to the processor 102 may define the boundaries between the main chamber 602 and the elongate chambers 604A, 604B. For example, as seen in the example of FIG. 6, the fin structure 610A-1 defines a boundary between the main chamber 602 and the first elongate chamber 604A, and the fin structure 610B-1 defines a boundary between the main chamber 602 and the second elongate chamber 604B. In some instances, the dimensions D2 and D4 may be measured relative to the boundaries between the main chamber 602 and the elongate chambers 604A, 604B, as seen in FIGS. 5 and 6.

Figure 12:
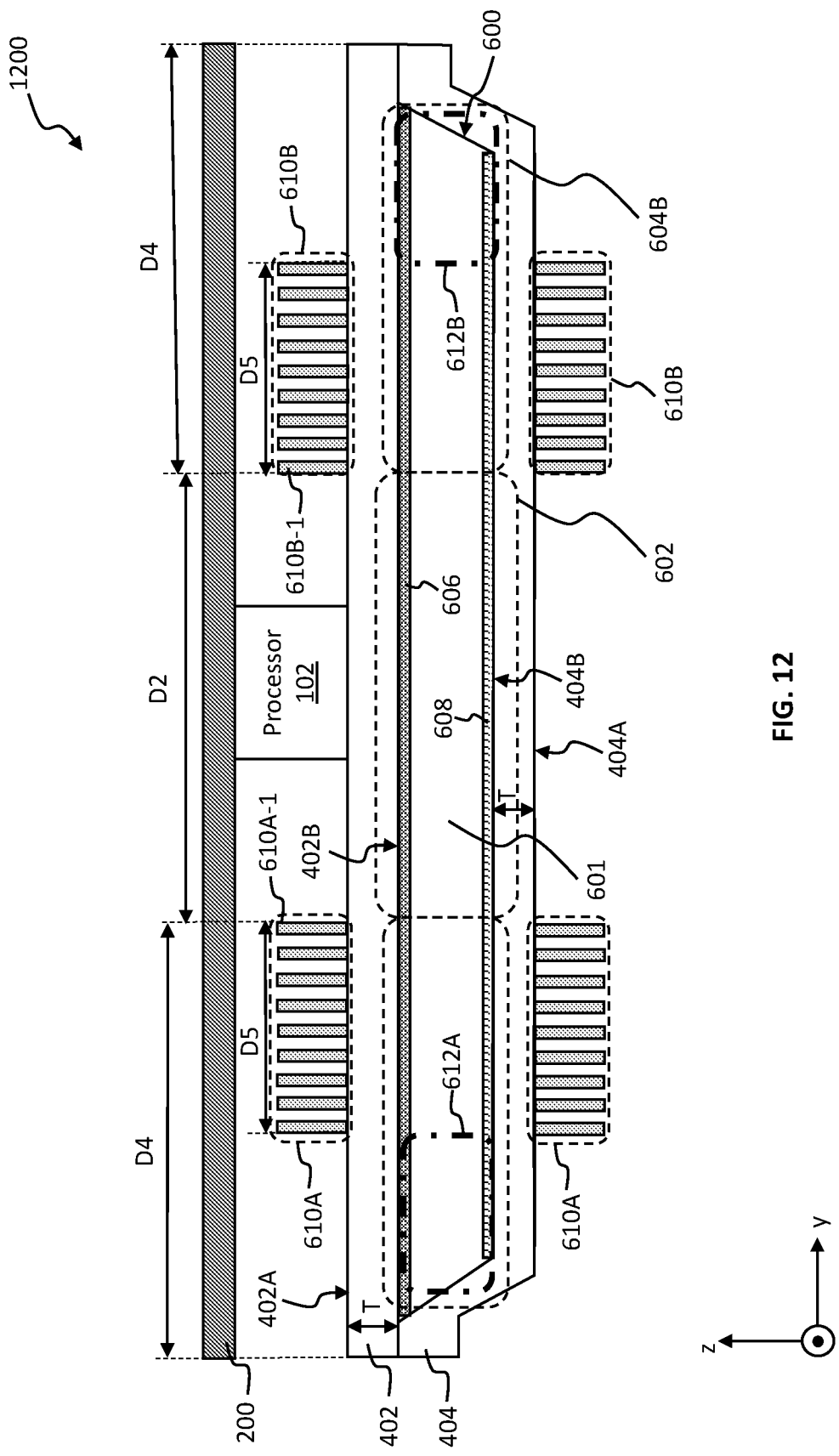
FIG. 12 is a diagram showing a cross-sectional view of an example vapor chamber, according to another implementation of the present disclosure.

The fin structures 610A, 610B may be disposed on either the first surface 402A of the cover portion 402 or the first surface 404A of the base portion 404. In some instances, the fin structures 610A, 610B may be disposed on both the first surface 402A of the cover portion 402 and the first surface 404A of the base portion 404 (e.g., as seen in the example of FIG. 12, which shows a cross-sectional view of an example vapor chamber 1200, according to another implementation of the present disclosure). In the example shown in FIG. 6, the first fin structure 610A may be positioned lateral to the processor 102 (e.g., in the second direction) and over a portion of the first elongate chamber 604A. Similarly, the second fin structure 610B may be positioned lateral to the processor 102 (e.g., in the second direction) and over a portion of the second elongate chamber 604B. In some implementations, a dimension D5 of the first and second fin structures 610A, 610B in the second direction (e.g., the farthest lateral extent in the Y-direction) may be less than the dimension D4. Consequently, as seen in the examples of FIGS. 5 and 6, a portion of the first elongate chamber 604A extends laterally in the second direction beyond a footprint of the first fin structure 610A, and a portion of the second elongate chamber 604B extends laterally in the second direction beyond a footprint of the second fin structure 610B.

The portions of the first and second elongate chambers 604A, 604B that extend laterally beyond (e.g., outside of) the footprints of the heat dissipation structure (e.g., first and second fin structures 610A, 610B, respectively) can be referred to as distal portions of the first and second elongate chambers 604A, 604B. The distal portions of the first and second elongate chambers 604A, 604B can serve as reservoirs 612A, 612B that store an excess volume of the working fluid (e.g., in the liquid state). For example, portions of the capillary structures 606, 608 that are disposed in the distal portions of the first and second elongate chambers 604A, 604B can serve as reservoirs 612A, 612B. In some implementations, these portions of the first and second elongate chambers 604A, 604B are suitable as reservoirs 612 since these portions may be the coolest portions of the vapor chamber 400, thus facilitating the storage of a liquid medium (e.g., working fluid in the liquid state) in the portions of the first and second capillary structures 606, 608 disposed in the reservoirs 612A, 612B.

When the processor 102 is operating in the normal operation/steady state power mode, the vapor chamber 400 is effective in dissipating the heat generated by the processor 102 by circulating a first volume (e.g., a nominal volume) of the working fluid within the sealed enclosure 600 (e.g., through repeated evaporation-condensation cycles), without tapping the excess volume of the working fluid (e.g., in the liquid state) stored in the reservoirs 612A, 612B and without increasing the thermal resistance of the vapor chamber 400 (e.g., since the excess volume of the working fluid is stored in the reservoirs 612A, 612B and not used in the repeated evaporation-condensation cycles). Conversely, when the processor 102 is operating in the turbo power mode, the vapor chamber 400 is effective in dissipating the higher amount of heat generated by the processor 102 by drawing the excess volume of the working fluid from the reservoirs 612A, 612B via capillary action (e.g., working fluid in the liquid state stored in the portions of the first and second capillary structures 606, 608 disposed in the reservoirs 612A, 612B), such that all the working fluid in the vapor chamber 400 (e.g., the nominal volume of the working fluid and the excess volume of the working fluid) is circulated within the sealed enclosure 600 (e.g., through repeated evaporation-condensation cycles).

In some instances, the amount of the working fluid used in the vapor chamber 400 may be in a range from about 1 gram to about 14 grams (e.g., from about 1 ml to about 14 ml in implementations where the working fluid is water). In some implementations, the nominal volume of the working fluid may be substantially equal to the excess volume of the working fluid. Consequently, twice the volume of working fluid may be circulated within the sealed enclosure 600 (e.g., through repeated evaporation-condensation cycles) when the processor 102 is operating in the turbo power mode compared to when the processor 102 is operating in the normal operation/steady state power mode. In some instances, the nominal volume of the working fluid may be in a range from about 2 ml to about 5 ml (e.g., about 3 ml when the processor 102 is operating at a steady state power of about 45 W). In such instances, the excess volume of the working fluid may also be in a range from about 2 ml to about 5 ml (e.g., so that about 6 ml is circulated within the sealed enclosure 600 when the processor 102 is operating at a turbo power of about 90 W).

Figure 7A:
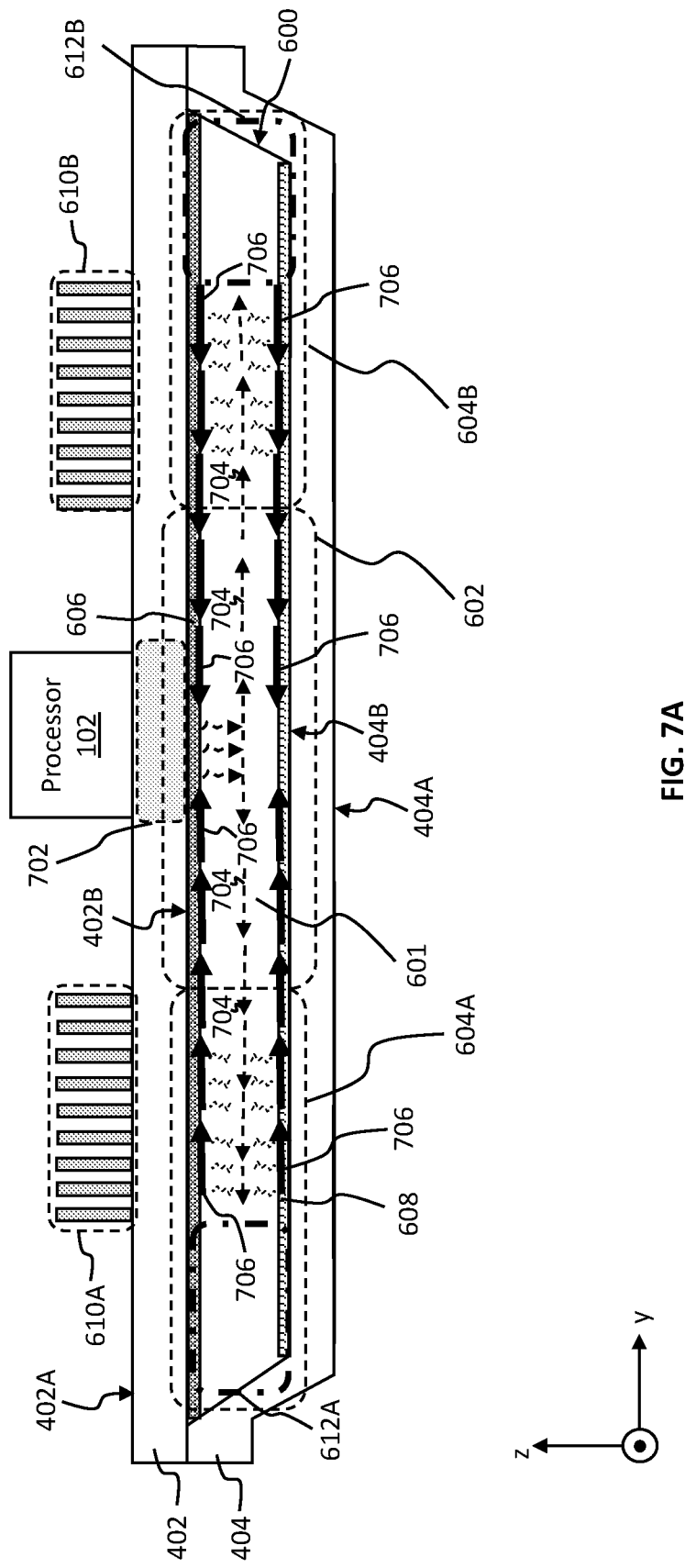
FIG. 7A is a diagram showing an example flow of working fluid in the example vapor chamber of FIG. 6 when a processor is operating in a normal operation/steady state power mode, according to an implementation of the present disclosure.
Figure 7B:
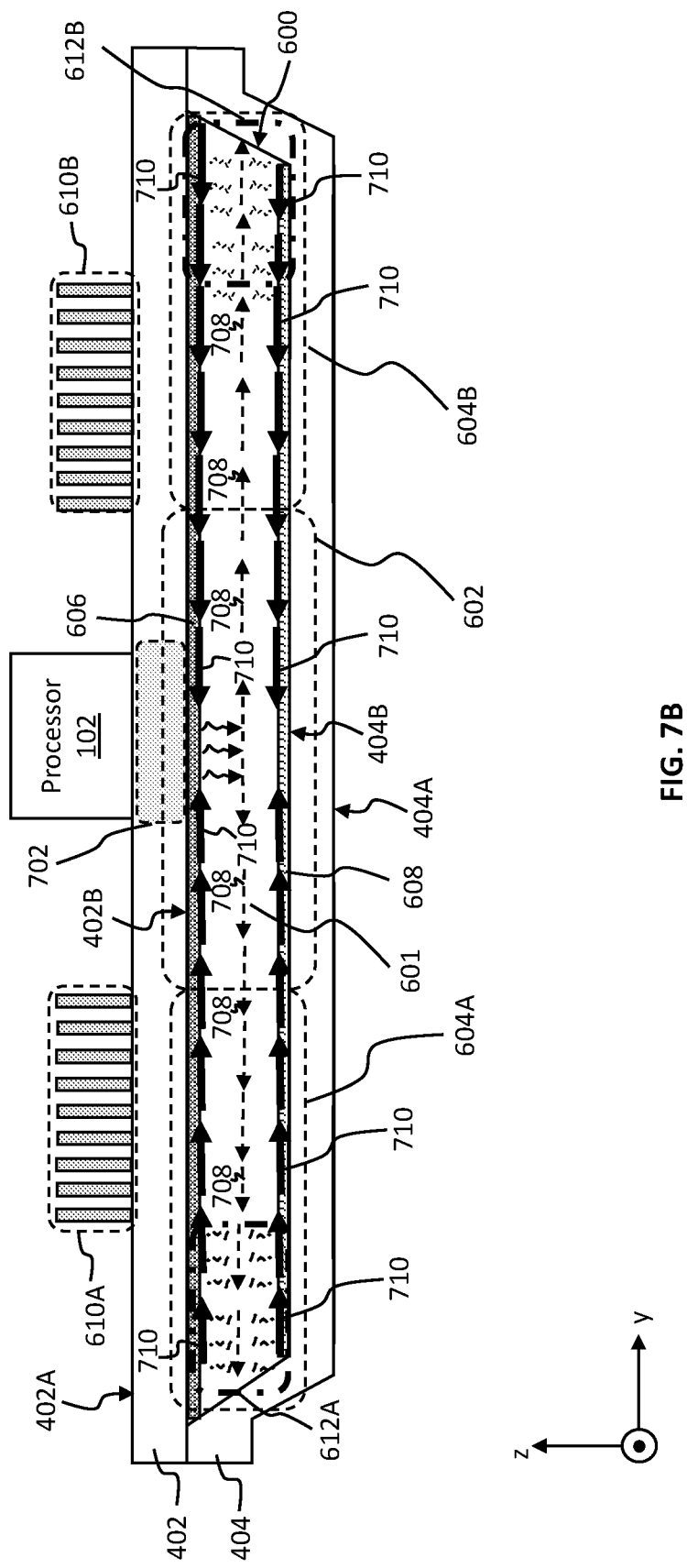
FIG. 7B is a diagram showing an example flow of working fluid in the example vapor chamber of FIG. 6 when a processor is operating in a turbo power mode, according to an implementation of the present disclosure.

FIG. 7A is a diagram showing an example flow of working fluid in the vapor chamber 400 when the processor 102 is operating in the normal operation/steady state power mode, according to an implementation of the present disclosure. FIG. 7B is a diagram showing an example flow of working fluid in the vapor chamber 400 when the processor 102 is operating in the turbo power mode, according to an implementation of the present disclosure. As discussed in FIG. 3, the processor 102 may initially be in a sleep or low power state (e.g., in time period $T_0$ shown in FIG. 3). When the processor 102 is in the sleep/low power state, the vapor chamber 400 is not in operation and therefore, the working fluid is not experiencing evaporation or condensation within the sealed enclosure 600. Consequently, the entire volume of the working fluid within the sealed enclosure 600 is in a liquid state. Furthermore, the working fluid evenly saturates the first and second capillary structures 606, 608. Additionally, there is an equal, equilibrium vapor pressure experienced across the entire volume of the air gap 601.

Referring to FIG. 7A, when the processor 102 is in the normal operation/steady state power mode (e.g., in time period $T_2$ shown in FIG. 3), the portion 702 of the vapor chamber 400 that is in physical contact with the processor 102 increases in temperature. As a result, the working fluid at the portion 702 (e.g., in the first capillary structure 606 and in the liquid state) absorbs the heat from the processor 102 and vaporizes. The latent heat of vaporization absorbed by the working fluid at the portion 702 reduces the temperature at the portion 702, thus dissipating heat from the processor 102. As the vapor travels through the center of the sealed enclosure 600 (e.g., illustrated by arrows 704), it leaves the evaporation zone (e.g., an area in the vicinity of the processor 102) and enters a condensation zone (e.g., an area in the vapor chamber 400 away from the processor 102). In the condensation zone, the vapor condenses, thus releasing the latent heat into the walls of the vapor chamber 400. In the example of FIG. 7A, the vapor is captured by, and condenses into, portions of the first and second capillary structures 606, 608 that are outside the reservoirs 612A, 612B. As vaporization of the working fluid at the portion 702 occurs, working fluid (in the liquid state) is drawn from the condensation zone to the evaporation zone through the first and second capillary structures 606, 608 via capillary action (e.g., illustrated by arrows 706). This evaporation-condensation cycle is repeated while the processor 102 is in the normal operation/steady state power mode. In the normal operation/steady state power mode, the nominal volume of working fluid is used in the evaporation-condensation cycles, and the excess volume of the working fluid (e.g., in the liquid state) that is stored in the reservoirs 612A, 612B is left unused since the increased vapor pressure in the evaporation zone causes the fluid transfer (e.g., illustrated by arrows 704 and 706) to reach an equilibrium before the working fluid in the reservoirs 612A, 612B is used.

Referring to FIG. 7B, when the processor 102 is in the turbo power mode (e.g., in time period $T_1$ shown in FIG. 3), the portion 702 of the vapor chamber 400 that is in physical contact with the processor 102 increases by a greater amount of temperature compared to when the processor 102 is in the normal operation/steady state power mode. The working fluid at the portion 702 (e.g., in the first capillary structure 606 and in the liquid state) absorbs the heat from the processor 102 and vaporizes. The latent heat of vaporization absorbed by the working fluid at the portion 702 reduces the temperature at the portion 702, thus dissipating heat from the processor 102. As the vapor travels through the center of the sealed enclosure 600 (e.g., illustrated by arrows 708), it leaves the evaporation zone and enters the condensation zone. The vaporization of the working fluid at the portion 702 when the processor 102 is in the turbo power mode causes a greater volume of working fluid (in the liquid state) to be drawn from the condensation zone to the evaporation zone through the first and second capillary structures 606, 608 via capillary action (e.g., compared to the case of FIG. 7A and as illustrated by arrows 710). This increase in the volume of working fluid is provided by the excess volume of the working fluid (e.g., in the liquid state) that is stored in the reservoirs 612A, 612B. In the turbo power mode, the entire volume of working fluid in the vapor chamber 400 is used in the evaporation-condensation cycles since the greater vapor pressure in the evaporation zone (e.g., compared to the case of FIG. 7A) causes the fluid transfer (e.g., illustrated by arrows 708 and 710) to reach an equilibrium when the excess volume of the working fluid in the reservoirs 612A, 612B is also used in the evaporation-condensation cycles.

Consequently, the vapor chamber 400 can modulate the volume of working fluid used in the evaporation-condensation cycles based on the operating state of the processor 102. The vapor chamber 400 can therefore be used to efficiently dissipate heat from the processor 102 when the processor 102 is in a normal operation/steady state power mode and to efficiently dissipate heat from the processor 102 when the processor 102 is in a turbo power mode. Therefore, in contrast to existing vapor chambers, the vapor chamber 400 can be used to dissipate heat when the processor 102 is in a turbo power mode (e.g., since both a nominal volume and an excess volume of the working fluid are used in the evaporation-condensation cycles when in the turbo power mode) and can have a lower thermal resistance when the processor 102 is in a normal operation/steady state power mode (e.g., since the nominal volume of the working fluid is used in the evaporation-condensation cycles when in the normal operation/steady state power mode).

Figure 8A:
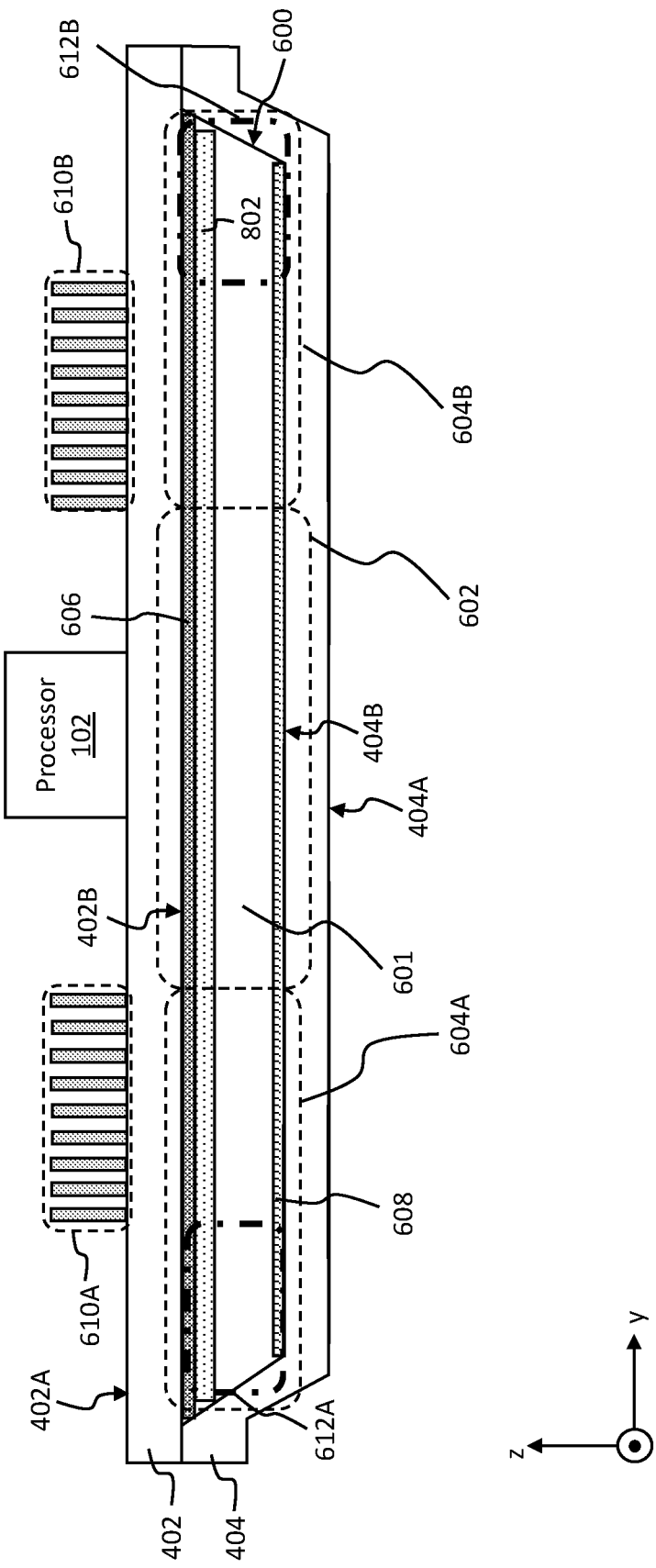
FIG. 8A is a diagram showing a cross-sectional view of the example vapor chamber shown in FIG. 4, according to another implementation of the present disclosure.
Figure 9A:
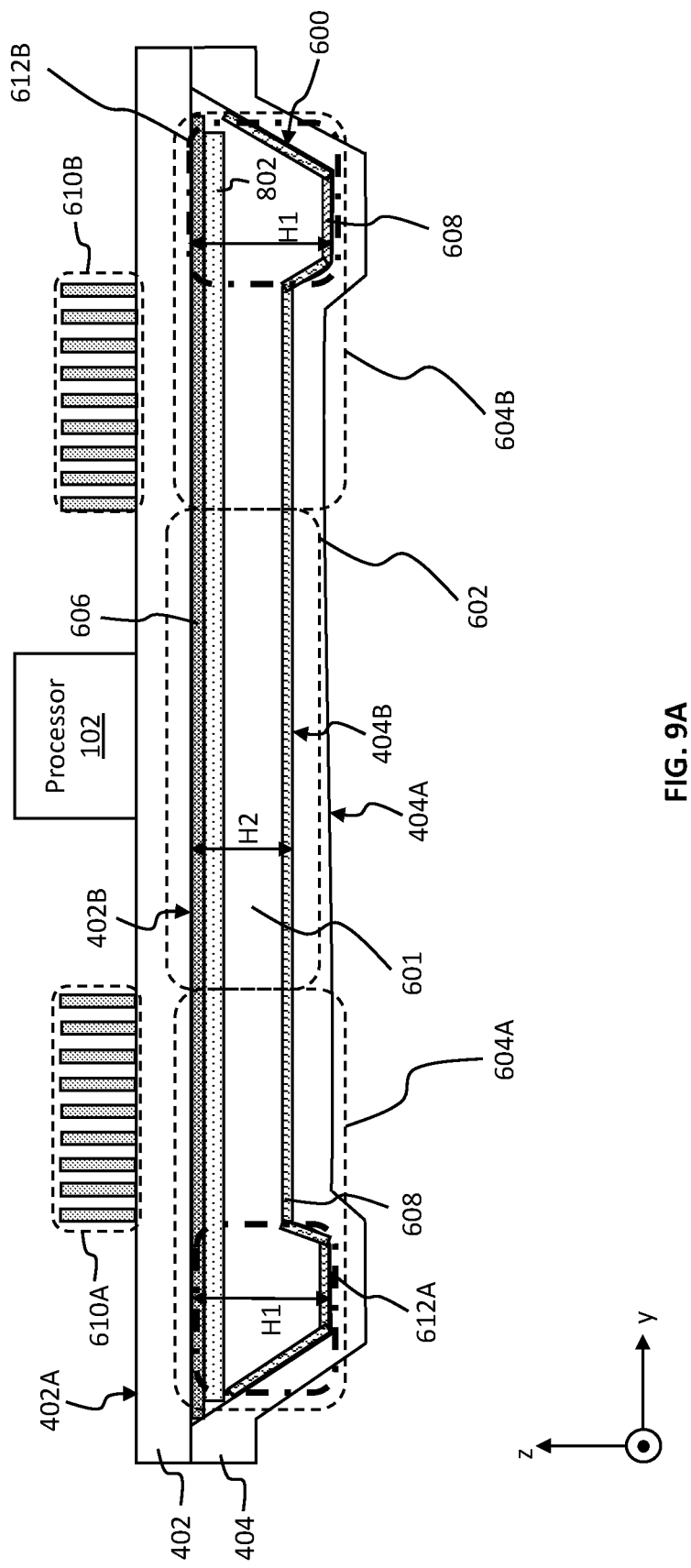
FIG. 9A is a diagram showing a cross-sectional view of the example vapor chamber shown in FIG. 4, according to yet another implementation of the present disclosure.
Figure 10A:
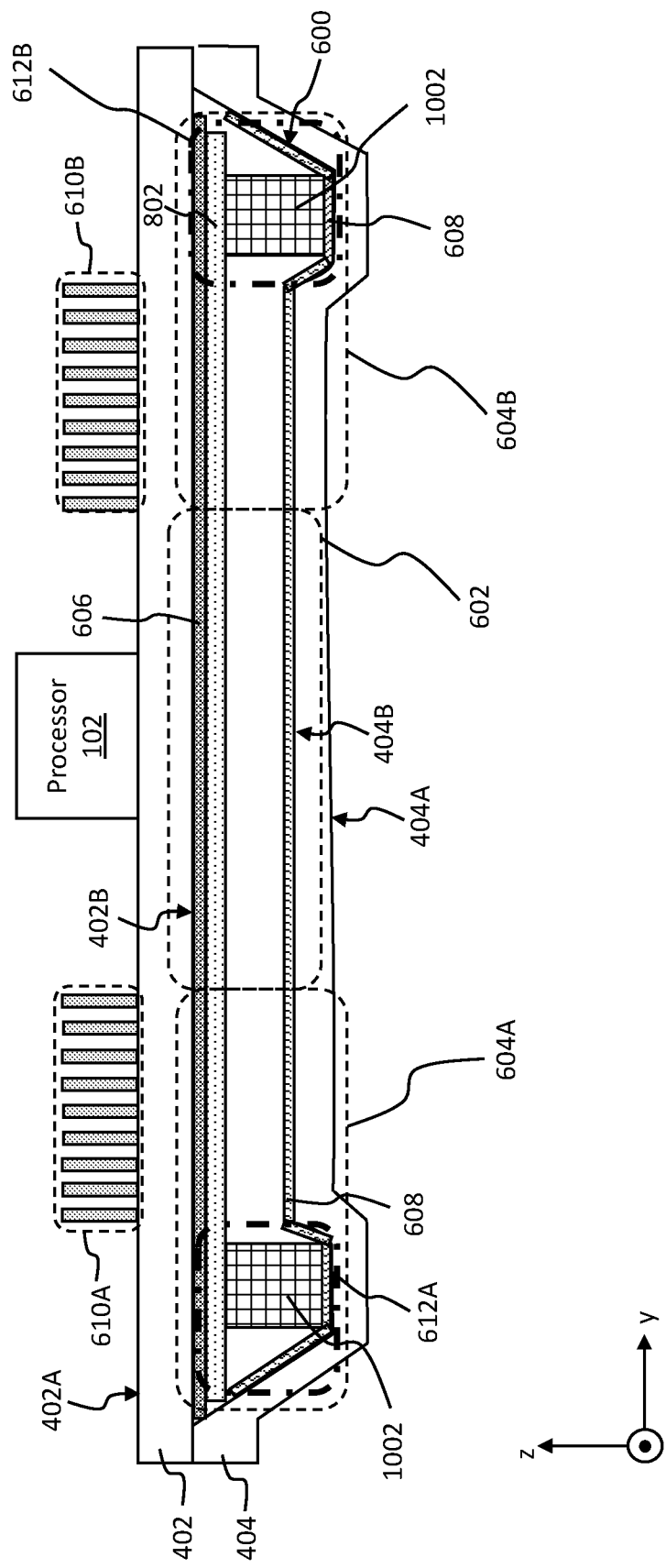
FIG. 10A is a diagram showing a cross-sectional view of the example vapor chamber shown in FIG. 4, according to a further implementation of the present disclosure.

In some implementations, the internal structure of the vapor chamber 400 (e.g. as illustrated in the example of FIG. 6) may be modified as seen in FIGS. 8A, 9A, and 10A. Similar to the vapor chamber 400 in the example of FIG. 6, in each of the examples shown in FIGS. 8A, 9A, and 10A, the vapor chamber 400 can modulate the volume of working fluid used in the evaporation-condensation cycles based on the operating state of the processor 102, thus allowing the vapor chamber 400 to be used to efficiently dissipate heat from the processor 102 when the processor 102 is in a normal operation/steady state power mode and to efficiently dissipate heat from the processor 102 when the processor 102 is in a turbo power mode.

Figure 8B:
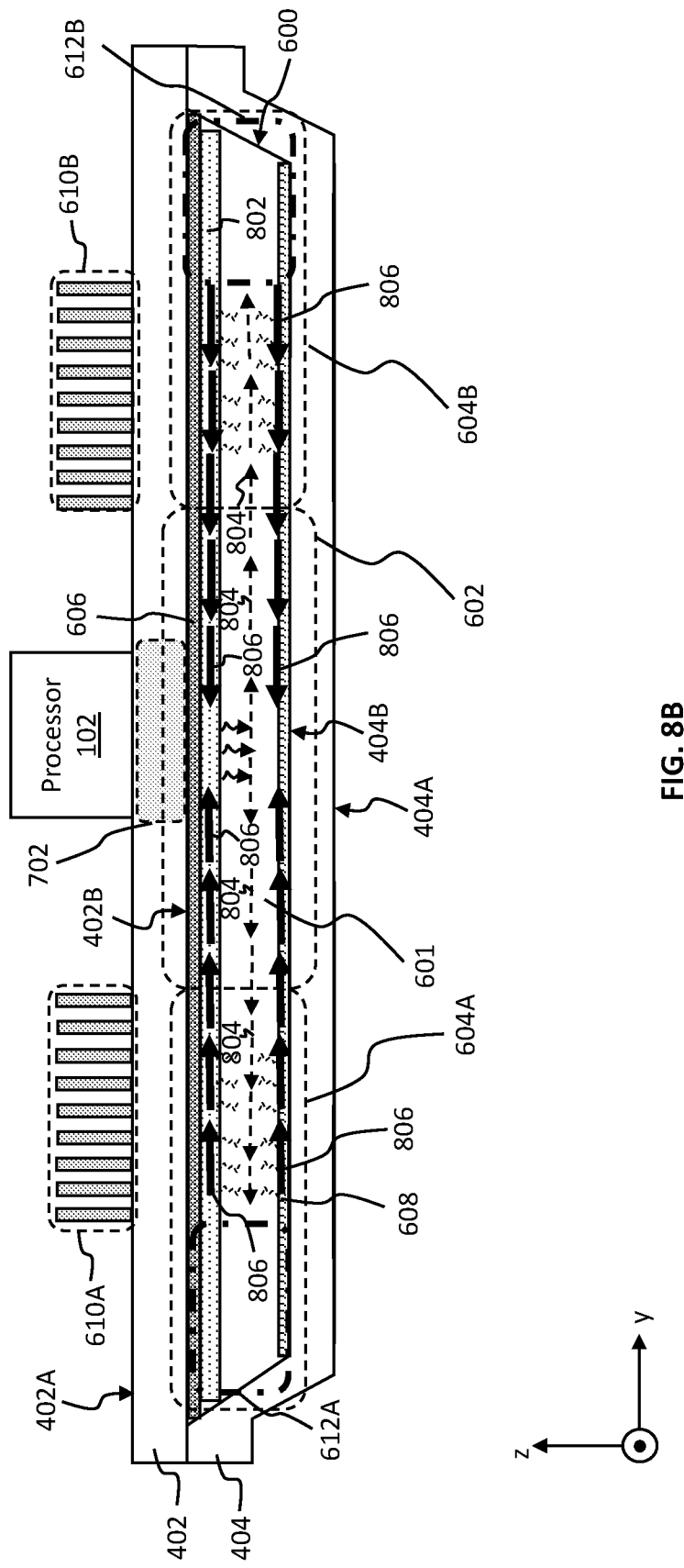
FIG. 8B is a diagram showing an example flow of working fluid in the example vapor chamber of FIG. 8A when a processor is operating in a normal operation/steady state power mode, according to an implementation of the present disclosure.
Figure 8C:
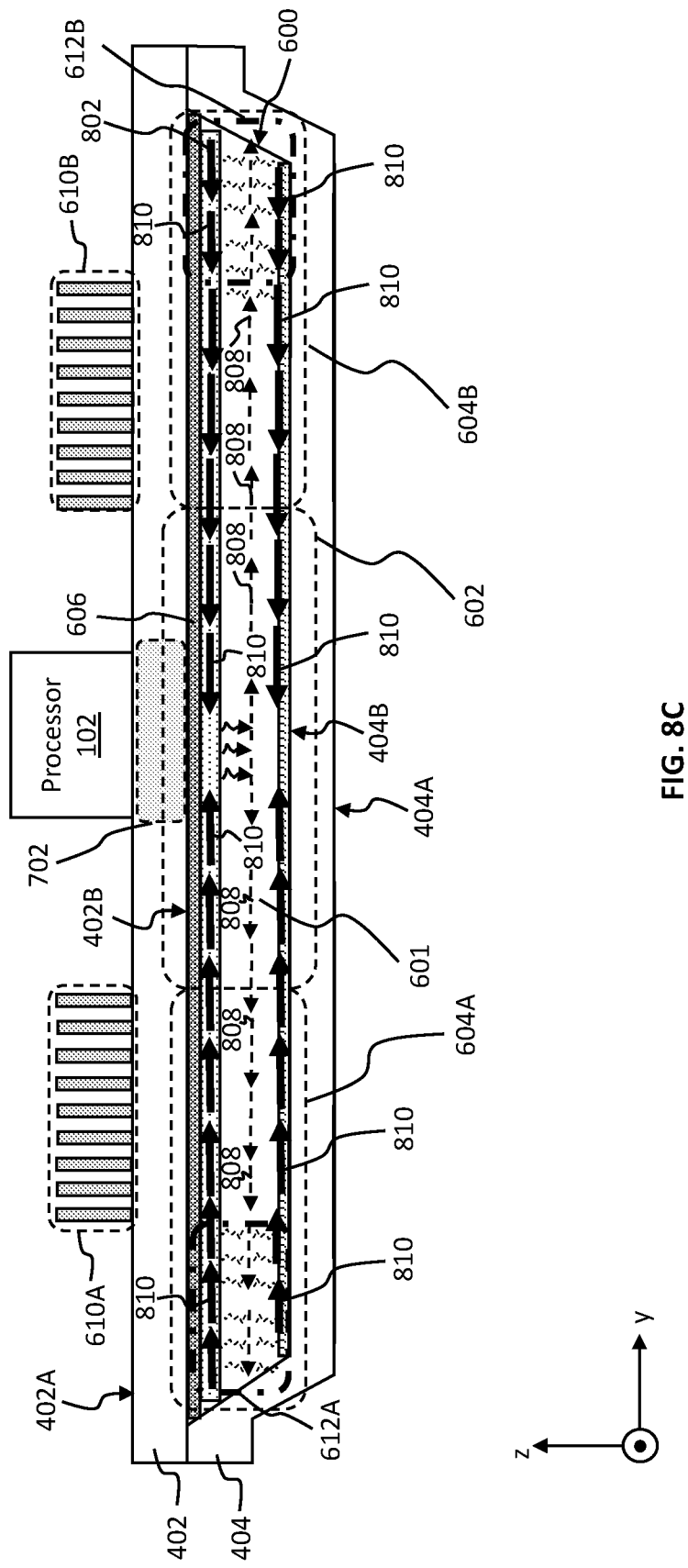
FIG. 8C is a diagram showing an example flow of working fluid in the example vapor chamber of FIG. 8A when a processor is operating in a turbo power mode, according to an implementation of the present disclosure.

FIG. 8A is a diagram showing a cross-sectional view of the example vapor chamber 400 shown in FIG. 4, according to another implementation of the present disclosure. FIG. 8B is a diagram showing an example flow of working fluid in the example vapor chamber of FIG. 8A when the processor 102 is operating in the normal operation/steady state power mode, according to an implementation of the present disclosure. FIG. 8C is a diagram showing an example flow of working fluid in the example vapor chamber of FIG. 8A when the processor 102 is operating in the turbo power mode, according to an implementation of the present disclosure. In contrast to the example shown in FIG. 6, the vapor chamber 400 shown in FIG. 8A includes a third capillary structure 802 that is attached to the cover portion 402 of the vapor chamber 400. Specifically, the third capillary structure 802 may be attached to (e.g., and be in physical contact with) the first capillary structure 606 and may be separated from the second capillary structure by the air gap 601. Portions of the capillary structures 606, 608, 802 that are disposed in the distal portions of the first and second elongate chambers 604A, 604B can serve as reservoirs 612A, 612B. In some implementations, the third capillary structure 802 may be formed from one or more metals (e.g., copper) and may be in a form of a sintered metal-containing powder, one or more layers of a metal-containing mesh, one or more layers of a metal-containing foam, a metal-containing fiber structure, or a combination thereof. As an example, the third capillary structure 802 may be a metal-containing fiber structure, while the first capillary structure 606 may be in the form of a sintered metal-containing powder, one or more layers of a metal-containing mesh, or one or more layers of a metal-containing foam. In some instances, the first, second, and third capillary structures 606, 608, 802 are saturated with the working fluid, and the cover and base portions 402, 404 (e.g., having the saturated capillary structures 606, 608, 802) are secured to each other to form the sealed enclosure 600.

As seen in FIG. 8B, when the processor 102 is in the normal operation/steady state power mode, the portion 702 of the vapor chamber 400 that is in physical contact with the processor 102 increases in temperature. As a result, the working fluid at the portion 702 (e.g., in the first and third capillary structures 606, 802 and in the liquid state) absorbs the heat from the processor 102 and vaporizes. The latent heat of vaporization absorbed by the working fluid at the portion 702 reduces the temperature at the portion 702, thus dissipating heat from the processor 102. As the vapor travels through the center of the sealed enclosure 600 (e.g., illustrated by arrows 804), it leaves the evaporation zone (e.g., an area in the vicinity of the processor 102) and enters a condensation zone (e.g., an area in the vapor chamber 400 away from the processor 102). In the condensation zone, the vapor condenses, thus releasing the latent heat into the walls of the vapor chamber 400. In the example of FIG. 8B, the vapor is captured by, and condenses into, portions of the second and third capillary structures 608, 802 that are outside the reservoirs 612A, 612B. As vaporization of the working fluid at the portion 702 occurs, working fluid (in the liquid state) is drawn from the condensation zone to the evaporation zone through the capillary structure 606, 608, 802 via capillary action (e.g., illustrated by arrows 806). This evaporation-condensation cycle is repeated while the processor 102 is in the normal operation/steady state power mode. As in the example shown in FIG. 8B, in the normal operation/steady state power mode, the nominal volume of working fluid is used in the evaporation-condensation cycles, and the excess volume of the working fluid (e.g., in the liquid state) that is stored in the reservoirs 612A, 612B is left unused since the increased vapor pressure in the evaporation zone causes the fluid transfer (e.g., illustrated by arrows 804 and 806) to reach an equilibrium before the working fluid in the reservoirs 612A, 612B is used.

Referring to FIG. 8C, when the processor 102 is in the turbo, the portion 702 of the vapor chamber 400 that is in physical contact with the processor 102 increases by a greater amount of temperature compared to when the processor 102 is in the normal operation/steady state power mode. The working fluid at the portion 702 (e.g., in the first and third capillary structures 606, 802 and in the liquid state) absorbs the heat from the processor 102 and vaporizes. The latent heat of vaporization absorbed by the working fluid at the portion 702 reduces the temperature at the portion 702, thus dissipating heat from the processor 102. As the vapor travels through the center of the sealed enclosure 600 (e.g., illustrated by arrows 808), it leaves the evaporation zone and enters the condensation zone. The vaporization of the working fluid at the portion 702 when the processor 102 is in the turbo power mode causes a greater volume of working fluid (in the liquid state) to be drawn from the condensation zone to the evaporation zone through the capillary structures 606, 608, 802 via capillary action (e.g., compared to the case of FIG. 8B and as illustrated by arrows 810). This increase in the volume of working fluid is provided by the excess volume of the working fluid (e.g., in the liquid state) that is stored in the reservoirs 612A, 612B. In the turbo power mode, the entire volume of working fluid in the vapor chamber 400 is used in the evaporation-condensation cycles since the greater vapor pressure in the evaporation zone (e.g., compared to the case of FIG. 8B) causes the fluid transfer (e.g., illustrated by arrows 808 and 810) to reach an equilibrium when the excess volume of the working fluid in the reservoirs 612A, 612B is also used in the evaporation-condensation cycles.

Figure 9B:
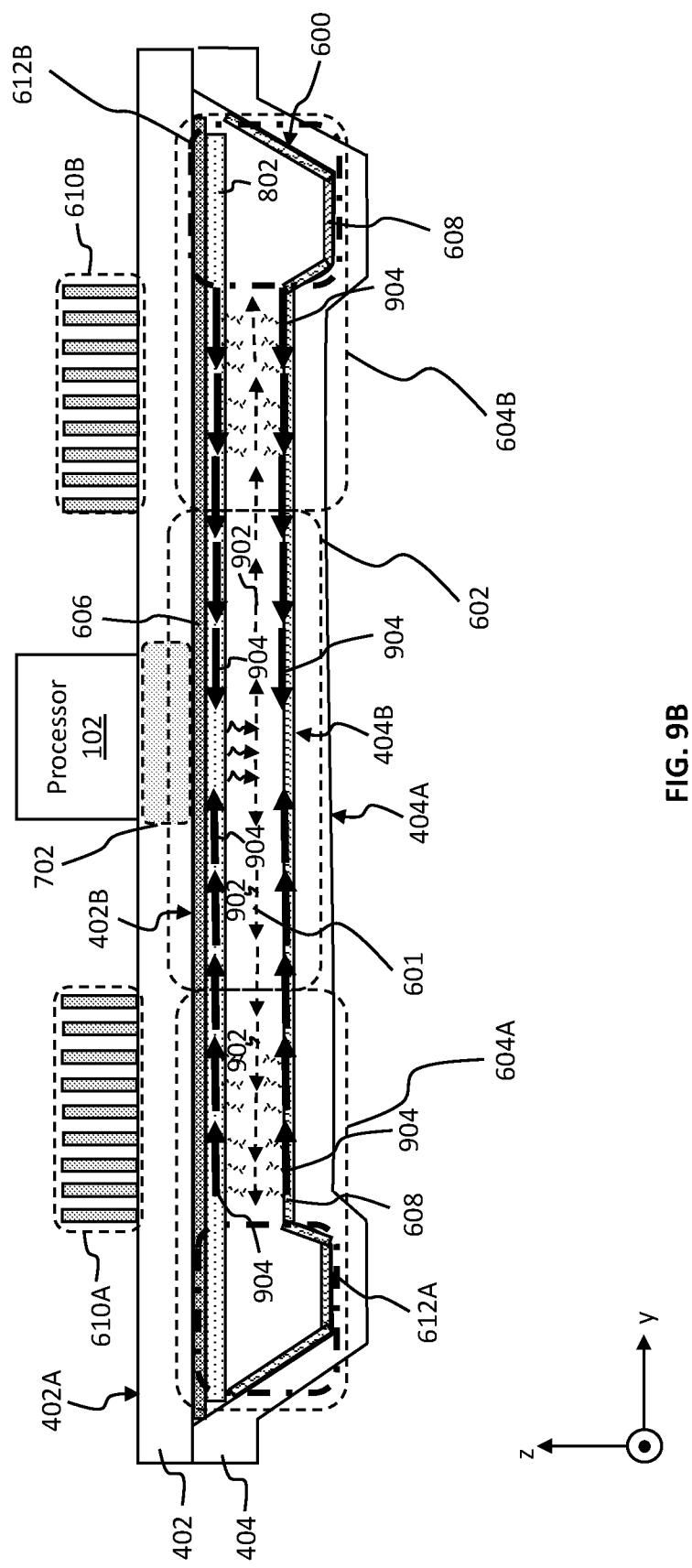
FIG. 9B is a diagram showing an example flow of working fluid in the example vapor chamber of FIG. 9A when a processor is operating in a normal operation/steady state power mode, according to an implementation of the present disclosure.
Figure 9C:
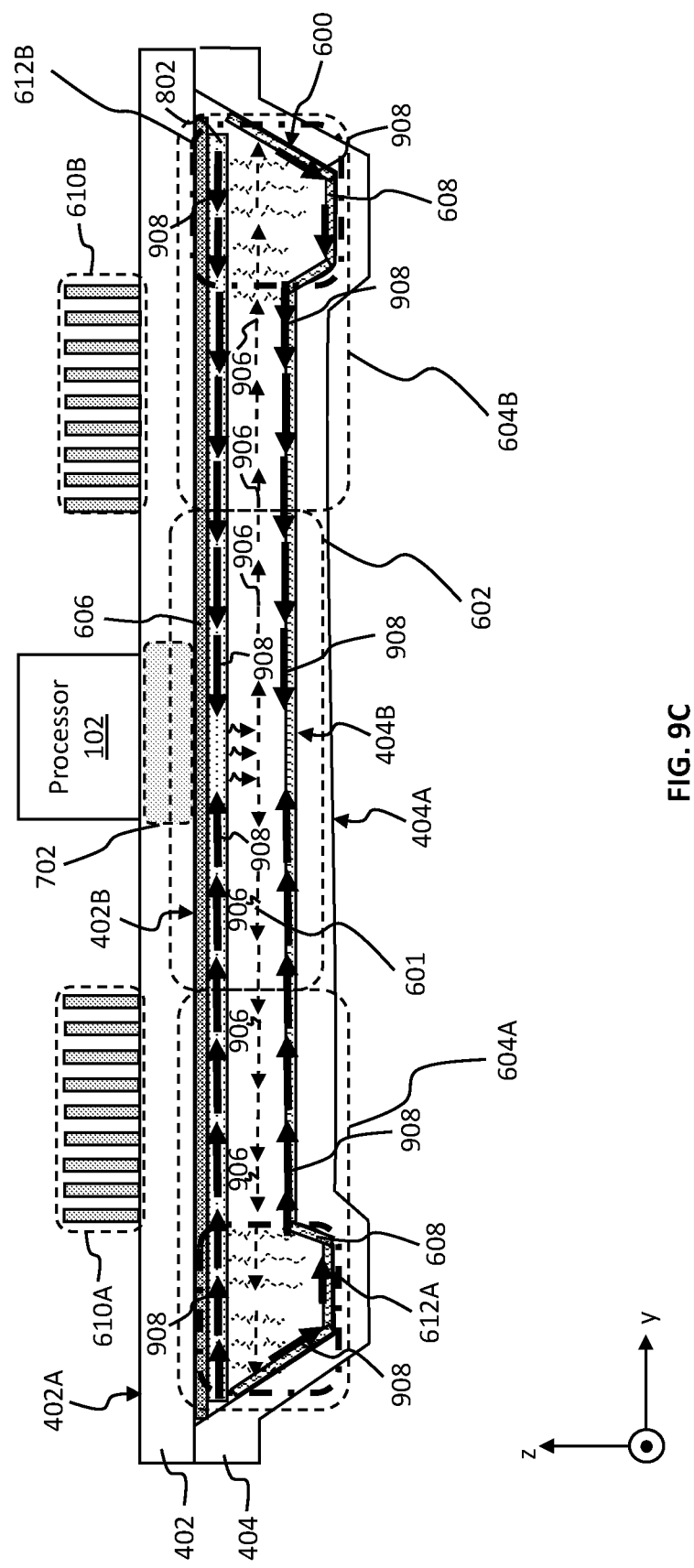
FIG. 9C is a diagram showing an example flow of working fluid in the example vapor chamber of FIG. 9A when a processor is operating in a turbo power mode, according to an implementation of the present disclosure.

FIG. 9A is a diagram showing a cross-sectional view of the example vapor chamber 400 shown in FIG. 4, according to yet another implementation of the present disclosure. FIG. 9B is a diagram showing an example flow of working fluid in the example vapor chamber of FIG. 9A when the processor 102 is operating in the normal operation/steady state power mode, according to an implementation of the present disclosure. FIG. 9C is a diagram showing an example flow of working fluid in the example vapor chamber of FIG. 9A when the processor 102 is operating in the turbo power mode, according to an implementation of the present disclosure. In contrast to the examples shown in FIGS. 6 and 8A, the reservoirs 612A, 612B shown in FIG. 9A have a height H1 that is different from a height H2 of the main chamber 602. As shown in the examples of FIG. 9A, the heights H1 and H2 may define distances between the surfaces 402B, 404B of the cover and base portions 402, 404 of the vapor chamber 400 (e.g., as measured in the third direction). The working principle of the vapor chamber 400 shown in FIG. 9A may be similar to the working principle of the vapor chamber 400 shown in FIG. 8A.

Specifically, as seen in FIG. 9B, when the processor 102 is in the normal operation/steady state power mode, the portion 702 of the vapor chamber 400 that is in physical contact with the processor 102 increases in temperature. As a result, the working fluid at the portion 702 (e.g., in the first and third capillary structures 606, 802 and in the liquid state) absorbs the heat from the processor 102 and vaporizes. The latent heat of vaporization absorbed by the working fluid at the portion 702 reduces the temperature at the portion 702, thus dissipating heat from the processor 102. As the vapor travels through the center of the sealed enclosure 600 (e.g., illustrated by arrows 902), it leaves the evaporation zone (e.g., an area in the vicinity of the processor 102) and enters a condensation zone (e.g., an area in the vapor chamber 400 away from the processor 102). In the condensation zone, the vapor condenses, thus releasing the latent heat into the walls of the vapor chamber 400. In the example of FIG. 9B, the vapor is captured by, and condenses into, portions of the second and third capillary structures 608, 802 that are outside the reservoirs 612A, 612B. As vaporization of the working fluid at the portion 702 occurs, working fluid (in the liquid state) is drawn from the condensation zone to the evaporation zone through the capillary structure 606, 608, 802 via capillary action (e.g., illustrated by arrows 904). This evaporation-condensation cycle is repeated while the processor 102 is in the normal operation/steady state power mode. As in the example shown in FIG. 9B, in the normal operation/steady state power mode, the nominal volume of working fluid is used in the evaporation-condensation cycles, and the excess volume of the working fluid (e.g., in the liquid state) that is stored in the reservoirs 612A, 612B is left unused since the increased vapor pressure in the evaporation zone causes the fluid transfer (e.g., illustrated by arrows 902 and 904) to reach an equilibrium before the working fluid in the reservoirs 612A, 612B is used.

Referring to FIG. 9C, when the processor 102 is in the turbo, the portion 702 of the vapor chamber 400 that is in physical contact with the processor 102 increases by a greater amount of temperature compared to when the processor 102 is in the normal operation/steady state power mode. The working fluid at the portion 702 (e.g., in the first and third capillary structures 606, 802 and in the liquid state) absorbs the heat from the processor 102 and vaporizes. The latent heat of vaporization absorbed by the working fluid at the portion 702 reduces the temperature at the portion 702, thus dissipating heat from the processor 102. As the vapor travels through the center of the sealed enclosure 600 (e.g., illustrated by arrows 906), it leaves the evaporation zone and enters the condensation zone. The vaporization of the working fluid at the portion 702 when the processor 102 is in the turbo power mode causes a greater volume of working fluid (in the liquid state) to be drawn from the condensation zone to the evaporation zone through the capillary structures 606, 608, 802 via capillary action (e.g., compared to the case of FIG. 9B and as illustrated by arrows 908). This increase in the volume of working fluid is provided by the excess volume of the working fluid (e.g., in the liquid state) that is stored in the reservoirs 612A, 612B. In the turbo power mode, the entire volume of working fluid in the vapor chamber 400 is used in the evaporation-condensation cycles since the greater vapor pressure in the evaporation zone (e.g., compared to the case of FIG. 9B) causes the fluid transfer (e.g., illustrated by arrows 906 and 908) to reach an equilibrium when the excess volume of the working fluid in the reservoirs 612A, 612B is also used in the evaporation-condensation cycles.

Figure 10B:
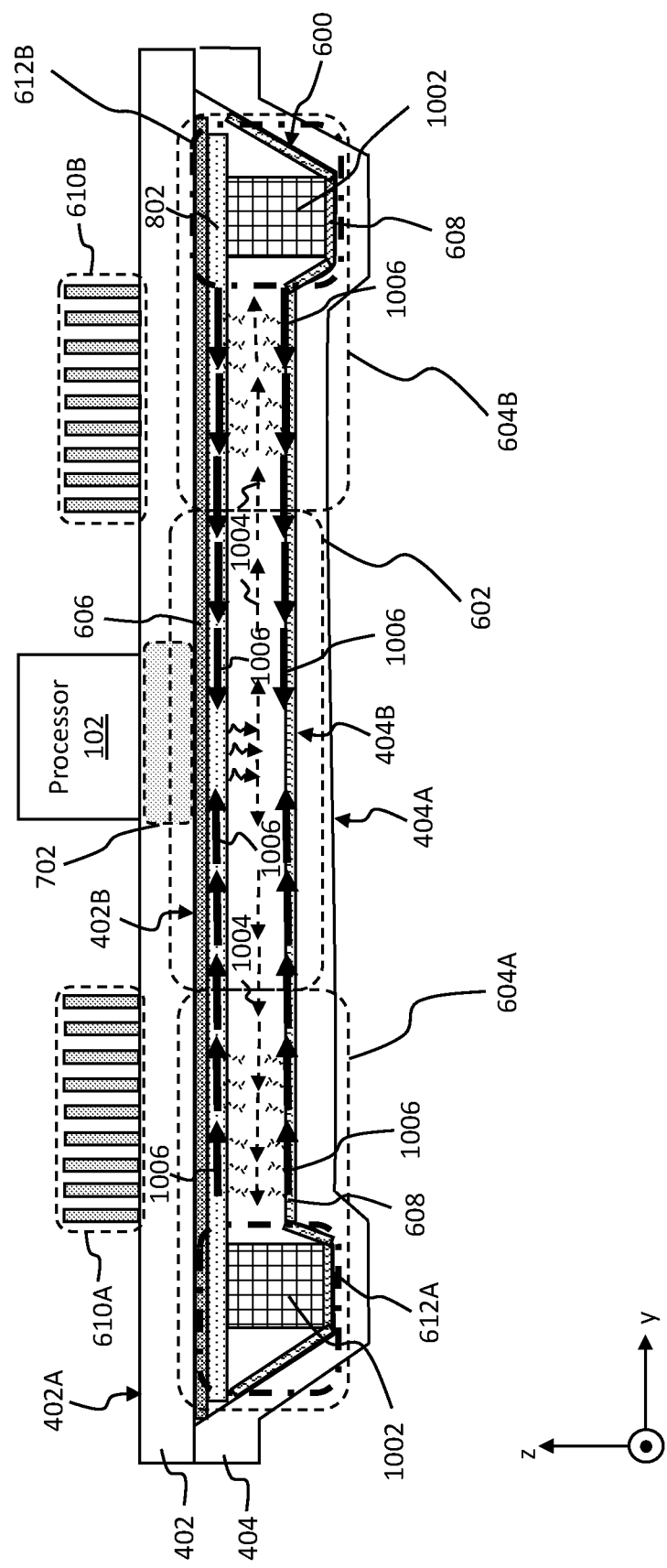
FIG. 10B is a diagram showing an example flow of working fluid in the example vapor chamber of FIG. 10A when a processor is operating in a normal operation/steady state power mode, according to an implementation of the present disclosure.
Figure 10C:
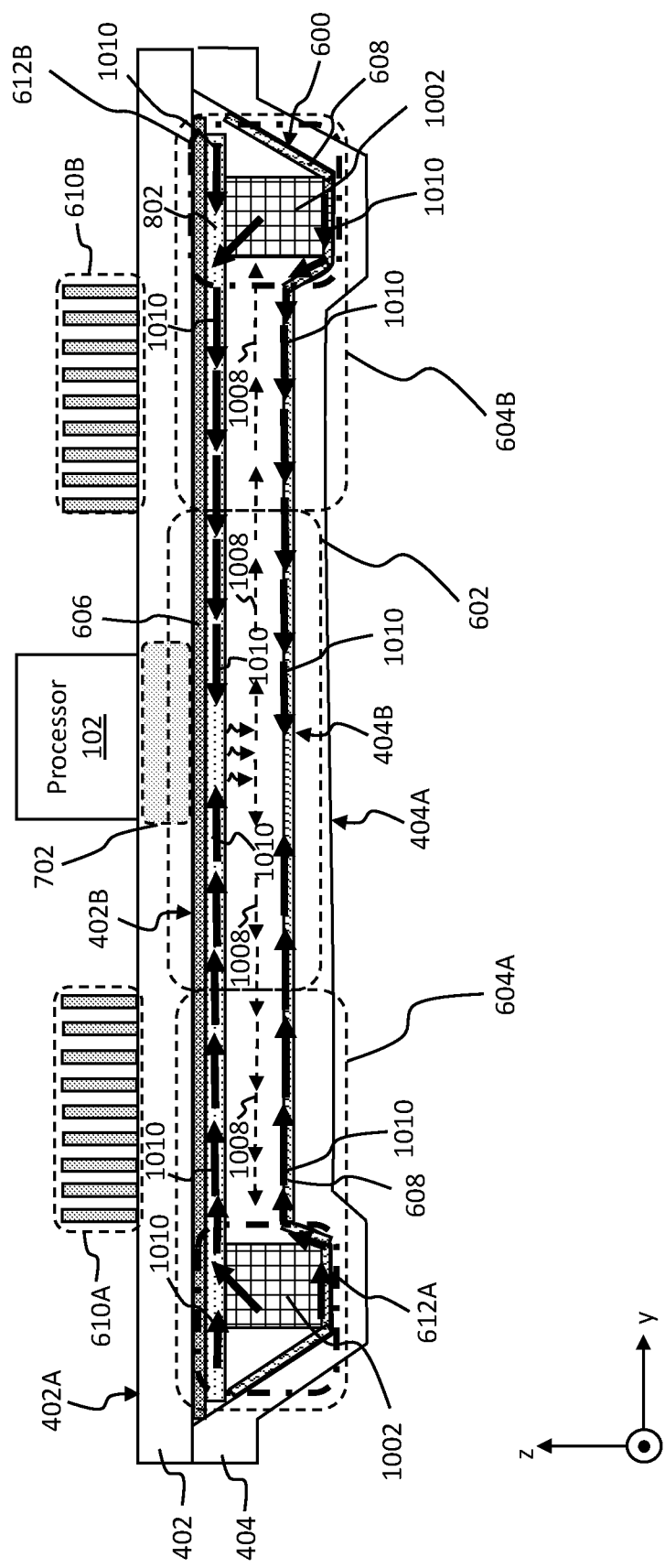
FIG. 10C is a diagram showing an example flow of working fluid in the example vapor chamber of FIG. 10A when a processor is operating in a turbo power mode, according to an implementation of the present disclosure.

FIG. 10A is a diagram showing a cross-sectional view of the example vapor chamber 400 shown in FIG. 4, according to a further implementation of the present disclosure. FIG. 10B is a diagram showing an example flow of working fluid in the example vapor chamber of FIG. 10A when the processor 102 is operating in the normal operation/steady state power mode, according to an implementation of the present disclosure. FIG. 10C is a diagram showing an example flow of working fluid in the example vapor chamber of FIG. 10A when the processor 102 is operating in the turbo power mode, according to a further implementation of the present disclosure. In contrast to the example shown in FIG. 9A, the reservoirs 612A, 612B shown in FIG. 10A accommodate a reservoir capillary structure 1002 that is disposed between (and that may be in physical contact with) the third capillary structure 802 and the second capillary structure 608. Portions of the capillary structures 606, 608, 802, 1002 that are disposed in the distal portions of the first and second elongate chambers 604A, 604B can serve as reservoirs 612A, 612B. The reservoir capillary structure 1002 may be formed from one or more metals (e.g., copper) and may be in a form of a sintered metal-containing powder, one or more layers of a metal-containing mesh, one or more layers of a metal-containing foam, a metal-containing fiber structure, or a combination thereof. In some instances, the first, second, third, and reservoir capillary structures 606, 608, 802, 1002 are saturated with the working fluid, and the cover and base portions 402, 404 (e.g., having the saturated capillary structures 606, 608, 802, 1002) are secured to each other to form the sealed enclosure 600.

As seen in FIG. 10B, when the processor 102 is in the normal operation/steady state power mode, the portion 702 of the vapor chamber 400 that is in physical contact with the processor 102 increases in temperature. As a result, the working fluid at the portion 702 (e.g., in the first and third capillary structures 606, 802 and in the liquid state) absorbs the heat from the processor 102 and vaporizes. The latent heat of vaporization absorbed by the working fluid at the portion 702 reduces the temperature at the portion 702, thus dissipating heat from the processor 102. As the vapor travels through the center of the sealed enclosure 600 (e.g., illustrated by arrows 1004), it leaves the evaporation zone (e.g., an area in the vicinity of the processor 102) and enters a condensation zone (e.g., an area in the vapor chamber 400 away from the processor 102). In the condensation zone, the vapor condenses, thus releasing the latent heat into the walls of the vapor chamber 400. In the example of FIG. 10B, the vapor is captured by, and condenses into, portions of the second and third capillary structures 608, 802 that are outside the reservoirs 612A, 612B. As vaporization of the working fluid at the portion 702 occurs, working fluid (in the liquid state) is drawn from the condensation zone to the evaporation zone through the capillary structure 606, 608, 802 via capillary action (e.g., illustrated by arrows 1006). This evaporation-condensation cycle is repeated while the processor 102 is in the normal operation/steady state power mode. As in the example shown in FIG. 10B, in the normal operation/steady state power mode, the nominal volume of working fluid is used in the evaporation-condensation cycles, and the excess volume of the working fluid (e.g., in the liquid state) that is stored in the reservoir capillary structure 1002 located in the reservoirs 612A, 612B is left unused since the increased vapor pressure in the evaporation zone causes the fluid transfer (e.g., illustrated by arrows 1004 and 1006) to reach an equilibrium before the working fluid in the reservoir capillary structure 1002 is used.

Referring to FIG. 10C, when the processor 102 is in the turbo power mode, the portion 702 of the vapor chamber 400 that is in physical contact with the processor 102 increases by a greater amount of temperature compared to when the processor 102 is in the normal operation/steady state power mode. The working fluid at the portion 702 (e.g., in the first and third capillary structures 606, 802 and in the liquid state) absorbs the heat from the processor 102 and vaporizes. The latent heat of vaporization absorbed by the working fluid at the portion 702 reduces the temperature at the portion 702, thus dissipating heat from the processor 102. As the vapor travels through the center of the sealed enclosure 600 (e.g., illustrated by arrows 1008), it leaves the evaporation zone and enters the condensation zone. The vaporization of the working fluid at the portion 702 when the processor 102 is in the turbo power mode causes a greater volume of working fluid (in the liquid state) to be drawn from the condensation zone to the evaporation zone from the reservoir capillary structure 1002 through the capillary structures 606, 608, 802 via capillary action (e.g., compared to the case of FIG. 10B and as illustrated by arrows 1010). This increase in the volume of working fluid is provided by the excess volume of the working fluid (e.g., in the liquid state) that is stored in the reservoir capillary structure 1002. In the turbo power mode, the entire volume of working fluid in the vapor chamber 400 is used in the evaporation-condensation cycles since the greater vapor pressure in the evaporation zone (e.g., compared to the case of FIG. 10B) causes the fluid transfer (e.g., illustrated by arrows 1008 and 1010) to reach an equilibrium when the excess volume of the working fluid in the reservoir capillary structure 1002 is also used in the evaporation-condensation cycles.

Figure 11:
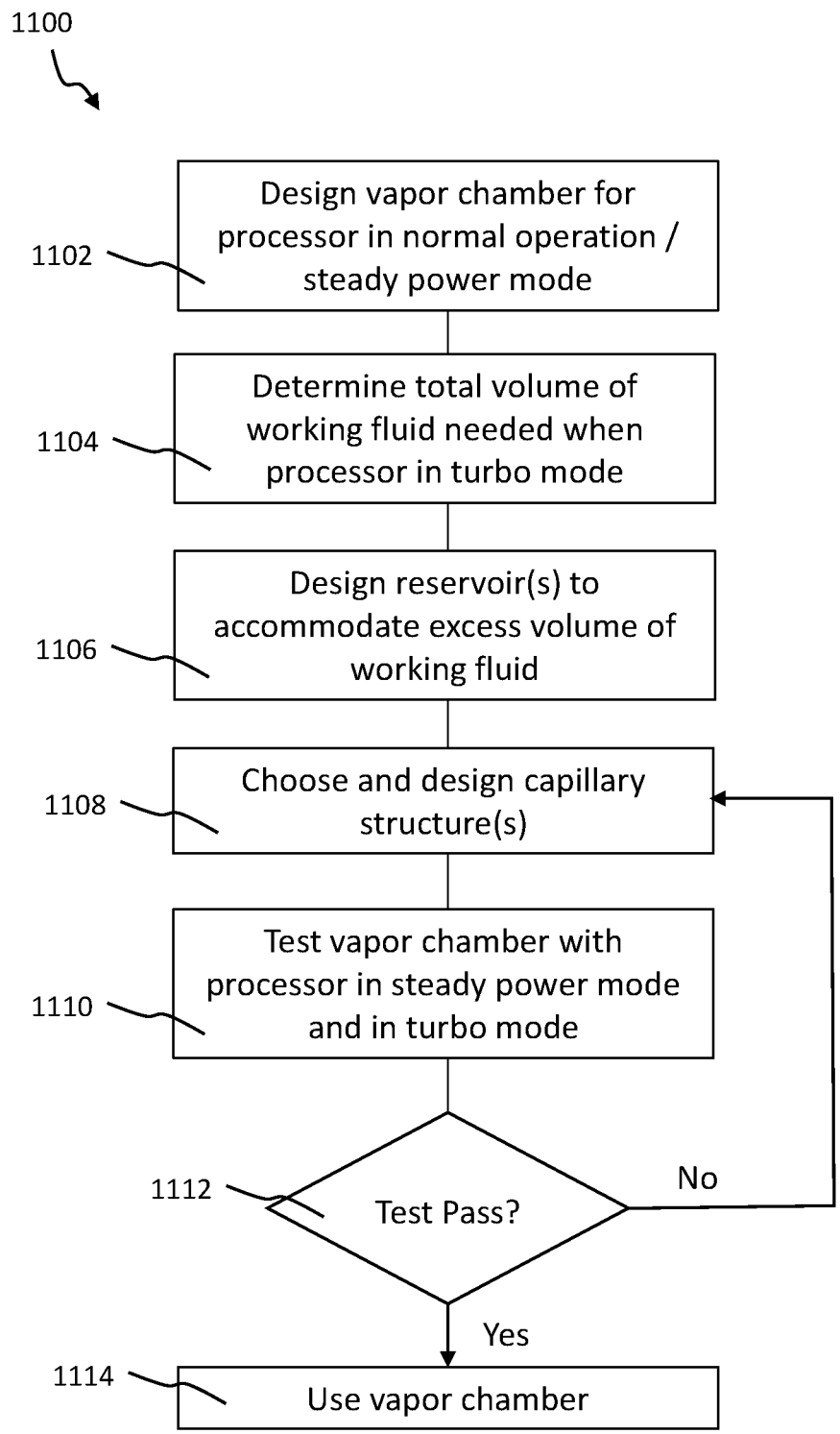
FIG. 11 is a flowchart illustrating a process for designing a vapor chamber having reservoirs and configured to modulate a volume of working fluid used in evaporation-condensation cycles based on an operating state of a processor, according to an implementation of the present disclosure.

FIG. 11 is a flowchart illustrating a process 1100 for designing a vapor chamber having reservoirs and configured to modulate a volume of working fluid used in evaporation-condensation cycles based on an operating state of a processor, according to an implementation of the present disclosure. The process 1100 may include additional or different operations, and the operations shown in FIG. 11 may be performed in the order shown or in another order. In some cases, one or more of the operations shown in FIG. 11 are implemented as processes that include multiple operations, sub-processes for other types of routines. In some cases, operations can be combined, performed in another order, performed in parallel, iterated or otherwise repeated or performed in another manner.

At 1102, a vapor chamber is designed for a processor in the normal operation/steady state power mode. A result of operation 1102 is a determination of the dimensions of the vapor chamber (e.g., the dimensions D1, D2, D3, D4, shown in FIG. 5 and the thickness T shown in FIG. 6). Another result of the operation 1102 is a determination of the nominal volume of the working fluid for the vapor chamber.

At 1104, the vapor chamber designed at 1102 is used to determine the total volume of the working fluid needed when the processor in the turbo power mode.

At 1106, one or more reservoirs (e.g., the reservoirs 612A, 612B) are designed to accommodate the excess volume of working fluid (e.g., which may be given by the difference between the total volume of the working fluid needed when the processor in the turbo power mode and the nominal volume of the working fluid). At 1106, the reservoir(s) are designed to comply with specifications regarding the electronic device 100 (e.g., system space requirements).

At 1108, one or more capillary structures are chosen and designed for the reservoir(s) (e.g., the reservoirs 612A, 612B). At 1110, the vapor chamber having the reservoir(s) and the capillary structure(s) therein is tested with the processor in the normal operation/steady state power mode and the processor in the turbo power mode.

At 1112, a determination is made as to whether the test at 1110 has passed. In response to a determination that the test at 1110 has failed, operation 1108 is repeated and another capillary structure is chosen and designed for the reservoir(s). Following the redesign of the capillary structure, the test at 1110 and the determination at 1112 are repeated. In response to a determination that the test at 1110 has passed, the vapor chamber designed by operations 1102, 1104, 1106, 1108, 1110 is then used (in 1114) for the electronic device 100 in order to modulate a volume of working fluid used in evaporation-condensation cycles based on an operating state of a processor.

Some of the subject matter and operations described in this specification can be implemented in digital electronic circuitry, or in computer software, firmware, or hardware, including the structures disclosed in this specification and their structural equivalents, or in combinations of one or more of them. Some of the subject matter described in this specification can be implemented as one or more computer programs, i.e., one or more modules of computer program instructions, encoded on a computer storage medium for execution by, or to control the operation of, data-processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

Some of the operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple implementations separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of implementations have been described. Nevertheless, it will be understood that various modifications can be made. Accordingly, other implementations are within the scope of the following claims.

What is claimed is:

1. A vapor chamber, comprising:
    a sealed enclosure comprising:
        a main chamber;
        a first elongate chamber extending laterally from a first side of the main chamber; and
        a second elongate chamber extending laterally from a second, opposite side of the main chamber;
    a first capillary structure lining a first interior surface of the sealed enclosure; and
    a second capillary structure lining a second, opposite interior surface of the sealed enclosure,
    wherein distal portions of the first elongate chamber and the second elongate chamber are configured as reservoirs that store an excess volume of a working fluid in a liquid state when a heat source is in a first operating state and release the excess volume of the working fluid towards the main chamber when the heat source is in a second operating state,
    wherein the distal portions of the first elongate chamber and the second elongate chamber are disposed outside a footprint of a heat dissipation structure disposed on an exterior surface of the vapor chamber.

2. The vapor chamber of claim 1, wherein the heat source comprises a processor, and the first operating state is a steady state power mode of the processor, and the second operating state is a turbo power mode of the processor.

3. The vapor chamber of claim 1, wherein portions of the first capillary structure and the second capillary structure disposed in the distal portions of the first elongate chamber and the second elongate chamber are configured as the reservoirs, wherein the excess volume of the working fluid is stored in and released from the portions of the first capillary structure and the second capillary structure disposed in the distal portions of the first elongate chamber and the second elongate chamber.

4. The vapor chamber of claim 1,
    wherein the heat dissipation structure comprises a first fin structure disposed over a portion of the first elongate chamber, and wherein the distal portion of the first elongate chamber is outside of the footprint of the first fin structure, and/or
    wherein the heat dissipation structure comprises a second fin structure disposed over a portion of the second elongate chamber, and wherein the distal portion of the second elongate chamber is outside of the footprint of the second fin structure.

5. The vapor chamber of claim 1, further comprising
    a third capillary structure attached to the first capillary structure, wherein the third capillary structure is positioned between the first capillary structure and the second capillary structure, wherein a distance between the first interior surface of the sealed enclosure and the second interior surface of the sealed enclosure in the main chamber is less than a distance between the first interior surface of the sealed enclosure and the second interior surface of the sealed enclosure in the reservoirs, and a reservoir capillary structure disposed in each of the reservoirs, the reservoir capillary structure positioned between the third capillary structure and the second capillary structure.

6. A vapor chamber, comprising:
a cover portion secured to a base portion to form a sealed enclosure, the sealed enclosure comprising:
 a main chamber;
 a first elongate chamber extending laterally in a first direction from a first side of the main chamber; and
 a second elongate chamber extending laterally in a second, opposite direction from a second, opposite side of the main chamber, wherein a width of the main chamber is greater than a width of the first elongate chamber and a width of the second elongate chamber;
a first capillary structure disposed in the main chamber, the first elongate chamber, and the second elongate chamber, the first capillary structure lining a first interior surface of the sealed enclosure; and
a second capillary structure disposed in the main chamber, the first elongate chamber, and the second elongate chamber, the second capillary structure lining a second, opposite interior surface of the sealed enclosure,
wherein portions of the first capillary structure and the second capillary structure disposed in distal portions of the first elongate chamber and the second elongate chamber are configured as reservoirs that modulate a volume of a working fluid circulating in the vapor chamber based on an operating state of a heat source.

7. The vapor chamber of claim 6, wherein the reservoirs are configured to:
 store an excess volume of the working fluid in a liquid state when the heat source is in a first operating state; and
 release the excess volume of the working fluid towards the main chamber when the heat source is in a second operating state.

8. The vapor chamber of claim 7, wherein:
 in the first operating state of the heat source, a nominal volume of the working fluid is configured to circulate in the vapor chamber; and
 in the second operating state of the heat source, the nominal volume of the working fluid and the excess volume of the working fluid are configured to circulate in the vapor chamber,
 wherein the nominal volume of the working fluid is substantially equal to the excess volume of the working fluid.

9. The vapor chamber of claim 7, wherein the heat source comprises a processor, and the first operating state is a steady state power mode of the processor, and the second operating state is a turbo power mode of the processor.

10. The vapor chamber of claim 6, wherein the distal portions of the first elongate chamber and the second elongate chamber are disposed outside a footprint of a heat dissipation structure disposed on an exterior surface of the vapor chamber.

11. The vapor chamber of claim 10,
 wherein the heat dissipation structure comprises a first fin structure formed on the cover portion and disposed over a portion of the first elongate chamber, and wherein the distal portion of the first elongate chamber is outside of the footprint of the first fin structure, and/or
 wherein the heat dissipation structure comprises a second fin structure formed on the cover portion and disposed over a portion of the second elongate chamber, and wherein the distal portion of the second elongate chamber is outside of the footprint of the second fin structure.

12. The vapor chamber of claim 6, further comprising
a third capillary structure attached to the first capillary structure, wherein the third capillary structure is positioned between the first capillary structure and the second capillary structure, wherein a distance between the first interior surface of the sealed enclosure and the second interior surface of the sealed enclosure in the main chamber is less than a distance between the first interior surface of the sealed enclosure and the second interior surface of the sealed enclosure in the reservoirs, and
a reservoir capillary structure disposed in each of the reservoirs, the reservoir capillary structure positioned between the third capillary structure and the second capillary structure.

13. A system, comprising:
a processor; and
a vapor chamber, wherein the processor is in physical contact with a surface of the vapor chamber, the vapor chamber comprising:
 a sealed enclosure comprising:
  a main chamber;
  a first elongate chamber extending laterally from a first side of the main chamber; and
  a second elongate chamber extending laterally from a second, opposite side of the main chamber;
 a first capillary structure lining a first interior surface of the sealed enclosure; and
 a second capillary structure lining a second, opposite interior surface of the sealed enclosure,
 wherein distal portions of the first elongate chamber and the second elongate chamber are configured as reservoirs that modulate a volume of a working fluid circulating in the vapor chamber based on an operating state of the processor,
 wherein the distal portions of the first elongate chamber and the second elongate chamber are disposed outside a footprint of a heat dissipation structure disposed on an exterior surface of the vapor chamber.

14. The system of claim 13, wherein portions of the first capillary structure and the second capillary structure disposed in the distal portions of the first elongate chamber and the second elongate chamber are configured as the reservoirs.

15. The system of claim 13, wherein:
 in a first operating state of the processor, a nominal volume of the working fluid is configured to circulate in the vapor chamber; and
 in a second operating state of the processor, the nominal volume and an excess volume of the working fluid are configured to circulate in the vapor chamber.

16. The system of claim 15,
 wherein the nominal volume of the working fluid is substantially equal to the excess volume of the working fluid, or wherein the reservoirs are configured to:
store the excess volume of the working fluid in a liquid state when the processor is in the first operating state; and
release the excess volume of the working fluid towards the main chamber when the processor is in the second operating state.

17. The system of claim 15, wherein the first operating state is a steady state power mode of the processor, and the second operating state is a turbo power mode of the processor.

18. The system of claim 13,
wherein the vapor chamber further comprises a third capillary structure attached to the first capillary structure, wherein the third capillary structure is positioned between the first capillary structure and the second capillary structure,
wherein a distance between the first interior surface of the sealed enclosure and the second interior surface of the sealed enclosure in the main chamber is less than a distance between the first interior surface of the sealed enclosure and the second interior surface of the sealed enclosure in the reservoirs,
wherein the vapor chamber further comprises a reservoir capillary structure disposed in each of the reservoirs, the reservoir capillary structure positioned between the third capillary structure and the second capillary structure.

* * * * *